(12) United States Patent
Choi et al.

(10) Patent No.: US 12,713,766 B2
(45) Date of Patent: Aug. 18, 2026

(54) DISPLAY APPARATUS

(71) Applicant: SAMSUNG DISPLAY CO., LTD., Yongin-si (KR)

(72) Inventors: Jonghyun Choi, Yongin-si (KR); Minjeong Oh, Yongin-si (KR); Kijune Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 304 days.

(21) Appl. No.: 18/073,239

(22) Filed: Dec. 1, 2022

(65) Prior Publication Data

US 2023/0371308 A1 Nov. 16, 2023

(30) Foreign Application Priority Data

May 11, 2022 (KR) ........................ 10-2022-0057983

(51) Int. Cl.
*H10K 59/121* (2023.01)
*G06F 1/16* (2006.01)
(Continued)

(52) U.S. Cl.
CPC ....... *H10K 59/1213* (2023.02); *G06F 1/1616* (2013.01); *G06F 1/1652* (2013.01);
(Continued)

(58) Field of Classification Search
CPC .. H10K 59/1213; H10K 59/131; H10K 59/65; H10K 59/123; H10K 59/124;
(Continued)

(56) References Cited

U.S. PATENT DOCUMENTS 9,577,203 B2 2/2017 Kim et al.
10,468,475 B2 11/2019 Cai
(Continued)

FOREIGN PATENT DOCUMENTS

CN 111312721 A 6/2020
CN 112038373 A * 12/2020 ......... H01L 27/3225
(Continued)

OTHER PUBLICATIONS

Ma1_English, ma translation (Year: 2020).*

*Primary Examiner* — Minsun O Harvey
*Assistant Examiner* — Alexander Ehrlich
(74) *Attorney, Agent, or Firm* — CANTOR COLBURN LLP

(57) ABSTRACT

A display apparatus includes a display panel in which a folding area and a non-folding area are defined, and a support layer disposed on the display panel. The support layer includes a first area corresponding to the folding area of the display panel and a second area corresponding to the non-folding area of the display panel, and the first area of the support layer includes a plurality of slits. The folding area of the display panel includes a slit corresponding area corresponding to a slit of the support layer and a rib corresponding area corresponding to a rib of the support layer, and the display panel includes a second display element disposed in the slit corresponding area, and a second pixel circuit disposed in the rib corresponding area and connected to the second display element.

22 Claims, 29 Drawing Sheets

(51) Int. Cl.

| | |
|---|---|
| ***H10D 86/40*** | (2025.01) |
| ***H10D 86/60*** | (2025.01) |
| ***H10K 59/131*** | (2023.01) |
| ***H10K 59/65*** | (2023.01) |
| ***H10K 59/80*** | (2023.01) |
| ***H10K 102/00*** | (2023.01) |

(52) U.S. Cl.
CPC ........... *H10D 86/441* (2025.01); *H10D 86/60* (2025.01); *H10K 59/131* (2023.02); *H10K 59/873* (2023.02); *H10K 59/65* (2023.02); *H10K 2102/311* (2023.02)

(58) Field of Classification Search
CPC .. H10K 59/353; H10K 59/352; H10K 59/121; H10K 59/60; H10K 50/844; H10K 2102/311; H10K 77/111; G06F 1/1616; G06F 1/1652; G06F 1/1641; H01L 27/124; H01L 27/1218; H01L 27/1248; Y02E 10/549; G09F 9/301
See application file for complete search history.

(56) References Cited

U.S. PATENT DOCUMENTS

| | | | | |
|---|---|---|---|---|
| 2019/0036068 | A1* | 1/2019 | Kim ...................... | G06F 1/1601 |
| 2019/0148476 | A1* | 5/2019 | Park ..................... | H10K 59/124 257/40 |
| 2019/0278145 | A1 | 9/2019 | Tanaka et al. | |
| 2021/0057494 | A1 | 2/2021 | Chung et al. | |
| 2021/0367020 | A1 | 11/2021 | Bok et al. | |

FOREIGN PATENT DOCUMENTS

| | | | |
|---|---|---|---|
| KR | 101834793 | B1 | 2/2018 |
| KR | 20190055868 | A | 5/2019 |
| KR | 1020210022818 | A | 3/2021 |
| KR | 102288350 | B1 | 8/2021 |
| KR | 20210145896 | A | 12/2021 |

* cited by examiner

DISPLAY APPARATUS

This application claims priority to Korean Patent Application No. 10-2022-0057983, filed on May 11, 2022, and all the benefits accruing therefrom under 35 U.S.C. § 119, the content of which in its entirety is herein incorporated by reference.

BACKGROUND

1. Field

One or more embodiments relate to a display panel and a display apparatus.

2. Description of the Related Art

Recently, display apparatuses are used in various fields. Also, as display apparatuses have become thinner and lighter, their range of use has widened.

As display apparatuses are variously used, there may be various methods of designing the shape of display apparatuses. Also, as the area occupied by a display area in a display apparatus has been expanded, various functions combined or associated with a display apparatus have been added.

SUMMARY

One or more embodiments include a high-resolution display apparatus capable of being flexible and robust against an external impact.

According to one or more embodiments, a display apparatus includes a display panel in which a folding area and a non-folding area are defined, and a support layer disposed on the display panel, where the support layer includes a first area corresponding to the folding area of the display panel and a second area corresponding to the non-folding area of the display panel. In such an embodiment, the first area of the support layer includes a plurality of slits, the folding area of the display panel includes a slit corresponding area corresponding to a slit of the support layer and a rib corresponding area corresponding to a rib of the support layer, and the display panel includes a first display element disposed in the rib corresponding area, a first pixel circuit disposed in the rib corresponding area and connected to the first display element, a second display element disposed in the slit corresponding area, and a second pixel circuit disposed in the rib corresponding area and connected to the second display element.

In an embodiment, the slit of the support layer may have a length in a first direction parallel to a folding axis of the folding area.

In an embodiment, the rib corresponding area of the display panel may have a size corresponding to a width of the rib of the support layer in a second direction perpendicular to the first direction of the support layer.

In an embodiment, the display panel may further include a first connection line which connects the second display element and the second pixel circuit to each other.

In an embodiment, the first connection line may be disposed in a same layer as a source or drain electrode of a thin film transistor included in the second pixel circuit.

In an embodiment, the first connection line may be disposed in a layer between the second display element and a source or drain electrode of a thin film transistor included in the second pixel circuit.

In an embodiment, the display panel may further include an inorganic insulating layer, in which a groove is defined to surround each of the first pixel circuit and the second pixel circuit.

In an embodiment, the display panel may further include an organic insulating layer covering the groove and disposed over the inorganic insulating layer.

In an embodiment, the inorganic insulating layer may include a plurality of inorganic insulating patterns surrounded by the groove, and the organic insulating layer may be disposed between the inorganic insulating patterns.

In an embodiment, the display panel may further include a third display element disposed in the non-folding area, and a third pixel circuit disposed in the non-folding area and connected to the third display element.

In an embodiment, the display apparatus may further include a component disposed under the display panel, where a component area overlapping the component in the non-folding area and an intermediate area between the component area and the non-folding area may be defined in the display panel.

In an embodiment, the component may include at least one selected from a camera, an imaging device, a solar cell, a flash, an illuminance sensor, a proximity sensor, an iris sensor, and a sound receiver.

In an embodiment, the display panel may further include a fourth display element disposed in the component area, a fourth pixel circuit disposed in the intermediate area and connected to the fourth display element, a fifth display element disposed in the intermediate area, and a fifth pixel circuit disposed in the intermediate area and connected to the fifth display element.

In an embodiment, the component area may include a transmission area surrounding the fourth display element.

In an embodiment, the display panel may further include a first connection line which connects the second display element and the second pixel circuit to each other, and a second connection line which connects the fourth display element and the fourth pixel circuit to each other.

In an embodiment, the second connection line may be disposed in a same layer as the first connection line and may include a same material as the first connection line.

According to one or more embodiments, a display apparatus includes a display panel in which a folding area and a non-folding area are defined, and a support layer disposed on the display panel and including a first area corresponding to the folding area of the display panel and a second area corresponding to the non-folding area of the display panel, where the first area of the support layer includes a plurality of slits, the folding area of the display panel includes a slit corresponding area corresponding to a slit of the support layer and a rib corresponding area corresponding to a rib of the support layer, and the display panel includes a first display element disposed in the slit corresponding area, a first pixel circuit disposed in the rib corresponding area and connected to the first display element, an inorganic insulating layer in which a groove is defined to surround the first pixel circuit, and an organic insulating layer covering the groove and disposed over the inorganic insulating layer.

In an embodiment, the display panel may further include a first connection line which connects the first display element and the first pixel circuit to each other, and the first connection line may be disposed in a same layer as a source or drain electrode of a thin film transistor included in the first pixel circuit.

In an embodiment, the display panel may further include a first connection line which connects the first display element and the first pixel circuit to each other, and the first connection line may be disposed in a layer between the first display element and a source or drain electrode of a thin film transistor included in the first pixel circuit.

In an embodiment, the display apparatus may further include a component disposed under the display panel, where a component area overlapping the component in the non-folding area and an intermediate area between the component area and the non-folding area may be defined in the display panel, and the display panel may further include a second display element disposed in the component area, and a second pixel circuit disposed in the intermediate area and connected to the second display element.

In an embodiment, the display panel may further include a first connection line which connects the first display element and the first pixel circuit to each other, and a second connection line which connects the second display element and the second pixel circuit to each other, and the second connection line may be disposed in a same layer as the first connection line and may include a same material as the first connection line.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
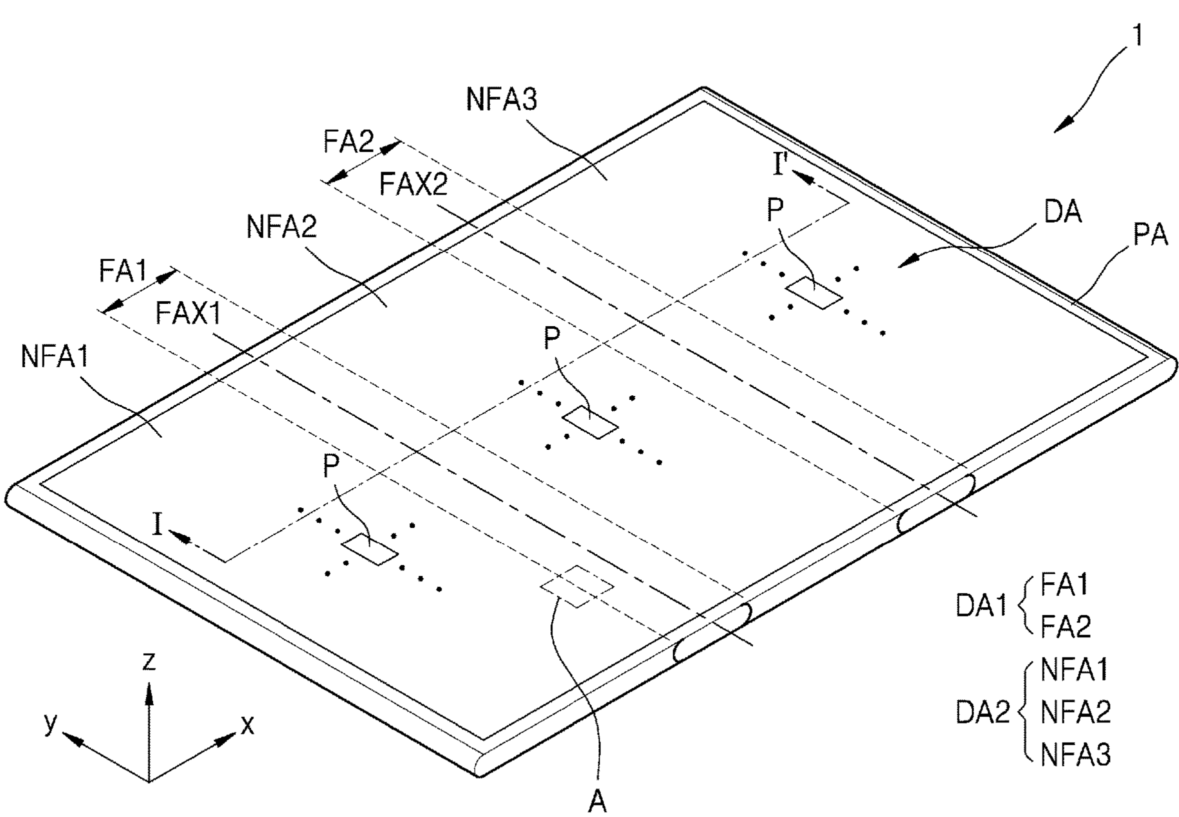
FIG. 1 is a perspective view schematically illustrating a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout, and repetitive detailed descriptions thereof may be omitted or simplified for conciseness.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Sizes of elements in the drawings may be exaggerated for convenience of description. In other words, because the sizes and thicknesses of elements in the drawings are arbitrarily illustrated for convenience of description, the disclosure is not limited thereto.

Also, herein, the x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another. Herein, the x axis direction, the y axis direction, and the z axis direction may be referred to as the x direction, the y direction and the z direction, respectively.

When a certain embodiment may be implemented differently, a particular process order may be performed differently from the described order. For example, two consecutively described processes may be performed substantially at the same time or may be performed in an order opposite to the described order.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
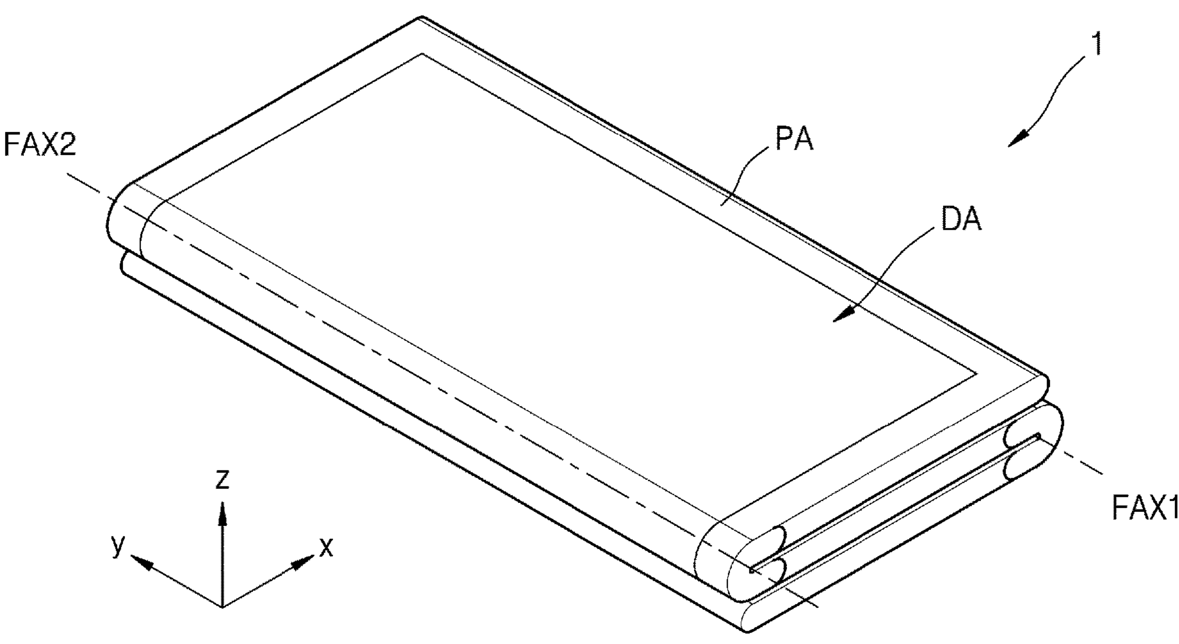
FIG. 2 is a perspective view schematically illustrating a folded form of a display apparatus according to an embodiment.

FIG. 1 is a perspective view schematically illustrating a display apparatus according to an embodiment. FIG. 2 is a perspective view schematically illustrating a folded form of a display apparatus according to an embodiment. Particularly, FIG. 1 is a perspective view illustrating a display apparatus 1 in an unfolded state, and FIG. 2 is a perspective view illustrating the display apparatus 1 in a folded state.

An embodiment of the display apparatus 1 may be an apparatus for displaying a moving image or a still image and may be used as a display screen of various products such as televisions, notebook computers, monitors, billboards, and Internet of Things (IoT) as well as portable electronic apparatuses such as mobile phones, smart phones, tablet personal computers (PCs), mobile communication terminals, electronic notebooks, electronic books, portable multimedia players (PMPs), navigation, and Ultra Mobile PCs (UMPCs). Also, the display apparatus 1 may be used in wearable devices such as smart watches, watch phones, glasses-type displays, and head-mounted displays (HMDs). Also, the display apparatus 1 may be used as a center information display (CID) arranged at a vehicle's instrument panel or a vehicle's center fascia or dashboard, a room mirror display replacing a vehicle's side mirror, or a display arranged at a rear side of a vehicle's front seat as an entertainment for a vehicle's rear seat.

As illustrated in FIG. 1, an embodiment of the display apparatus 1 may be substantially flat as a whole in the unfolded state. In an embodiment, the display apparatus 1 may be a foldable display apparatus such that the display apparatus 1 may be folded or bent as illustrated in FIG. 2.

In an embodiment, the display apparatus 1 may be folded in a way such that display surfaces thereof face each other. In an alternative embodiment, the display apparatus 1 may be folded in a way such that the display surface faces outward. Here, the "display surface" may be a surface where an image is displayed, the display surface may include a display area DA and a peripheral area PA, and an image may be provided to the user through the display area DA. Here, the term "folded" may mean that the shape is not fixed but may be modified from the original shape to another shape, and may include being folded along one or more particular lines, that is, a folding axis, curved, or rolled like a scroll.

Referring to FIGS. 1 and 2, an embodiment of the display apparatus 1 may include a display area DA and a peripheral area PA located outside the display area DA. The display area DA may be an area where a plurality of pixels P are arranged (or disposed) to display an image. The peripheral area PA may surround the display area DA and may be a non-display area where the pixels P are not arranged.

The display area DA may include a first display area DA1 and a second display area DA2. The first display area DA1 may be a flexible and foldable folding area, and one or more folding areas may be provided. The second display area DA2 may be a non-folding area that is not foldable (non-foldable). In such an embodiment, an area that is not foldable will be referred to as a non-folding area; however, this is merely for convenience of description, the expression "non-folding" may include not only a case of being non-flexible and thus being rigid but also a case of being flexible but being less flexible than the folding area and a case of being flexible but being non-foldable. The display apparatus 1 may display an image in the first display area DA1 and the second display area DA2.

The first display area DA1 may include a first folding area FA1 and a second folding area FA2. The first folding area FA1 may be foldable with respect to a first folding axis FAX1, and the second folding area FA2 may be foldable with respect to a second folding axis FAX2. In an embodiment, the first folding area FA1 and the second folding area FA2 may have similar areas or sizes as each other. In an alternative embodiment, the first folding area FA1 and the second folding area FA2 may have different areas or sizes from each other.

The second display area DA2 may include a first non-folding area NFA1, a second non-folding area NFA2, and a third non-folding area NFA3. The first folding area FA1 may be arranged (disposed or defined) between the first non-folding area NFA1 and the second non-folding area NFA2, and the second folding area FA2 may be arranged between the second non-folding area NFA2 and the third non-folding area NFA3.

Various electronic devices (components or modules), printed circuit boards, or the like may be electrically attached to the peripheral area PA, and a voltage line or the like for supplying power for driving a display element may be located therein. In an embodiment, for example, a scan driver for providing a scan signal to each pixel P, a data driver for providing a data signal to each pixel P, supply lines (clock signal lines, carry signal lines, driving voltage lines, and/or the like) for signals input to the scan driver and the data driver, and a main power line may be arranged in the peripheral area PA.

Figure 3:
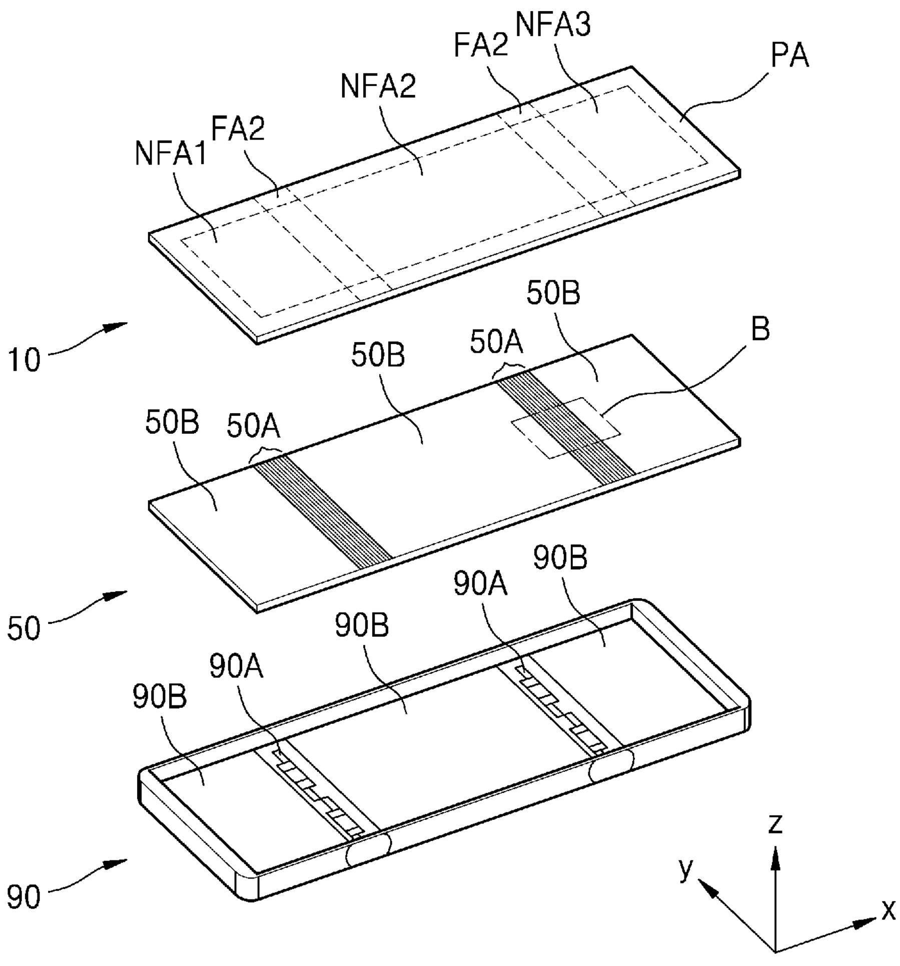
FIG. 3 is a schematic exploded perspective view illustrating a structure of the display apparatus of FIG. 1 according to an embodiment.
Figure 4A:
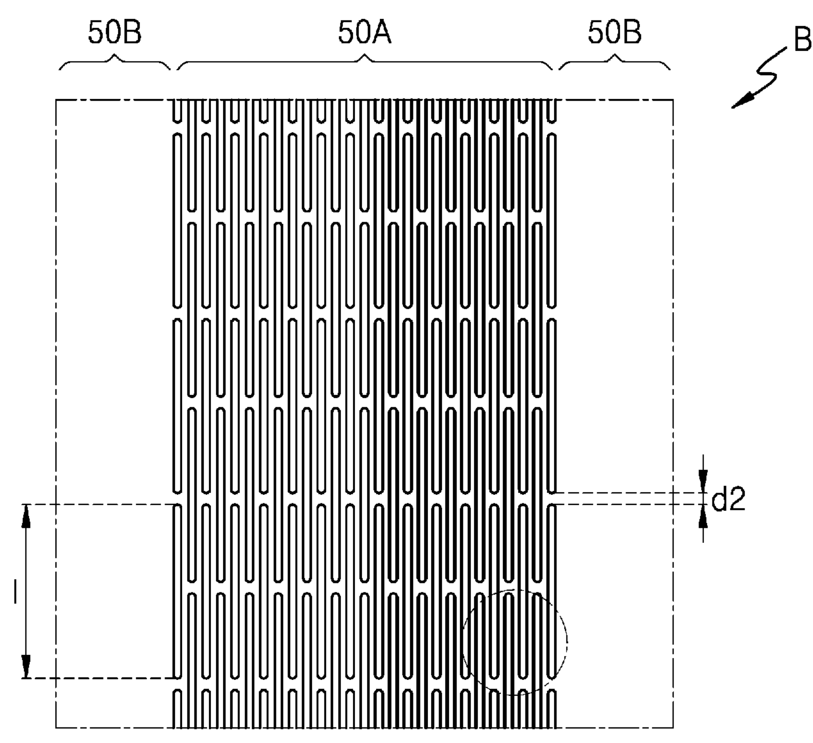
FIGS. 4A, 4B, 4C, and 5 are enlarged views of a portion of a support layer of FIG. 3.
Figure 4A:
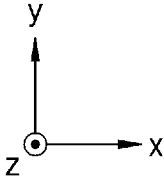
Figure 4B:
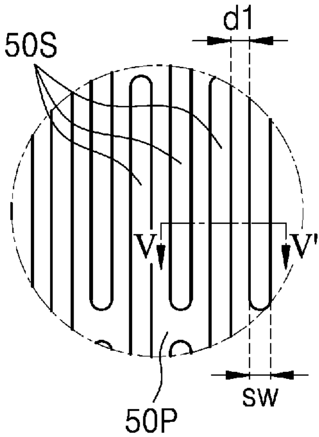
Figure 4C:
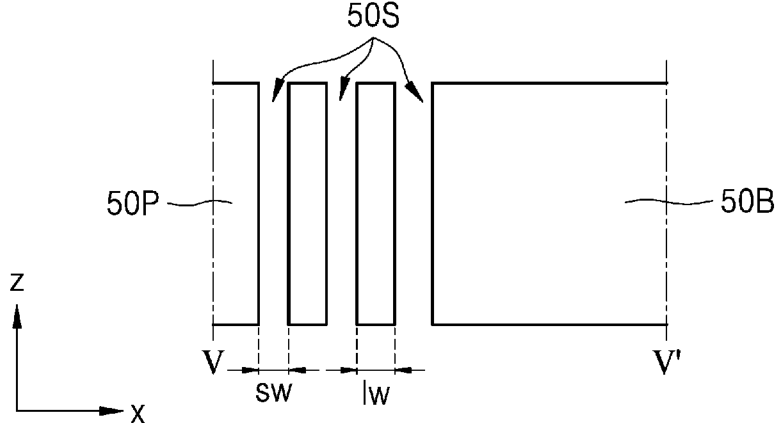
Figure 5:
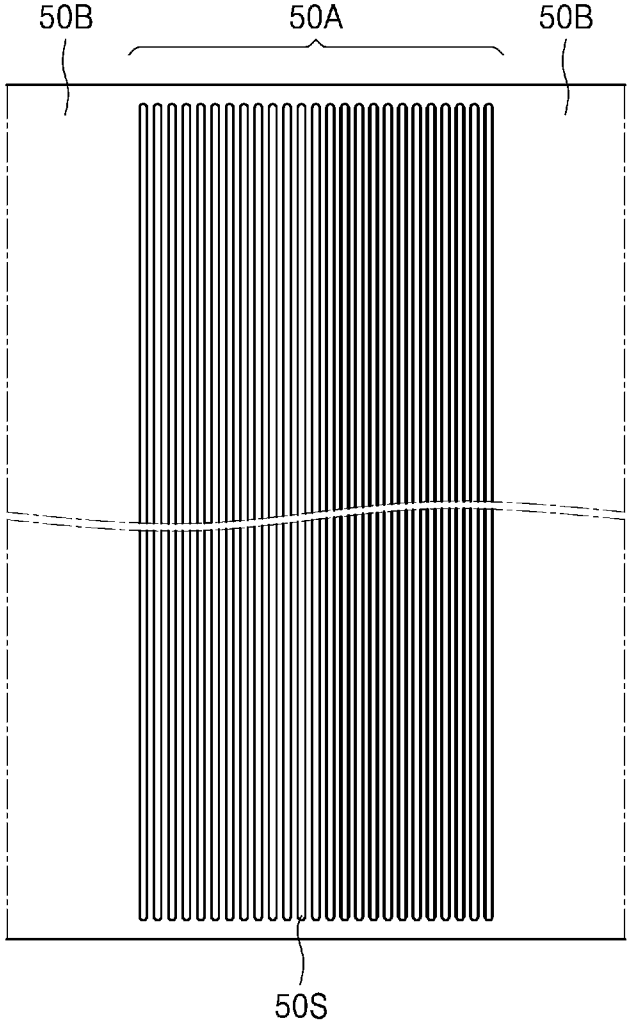
Figure 6:
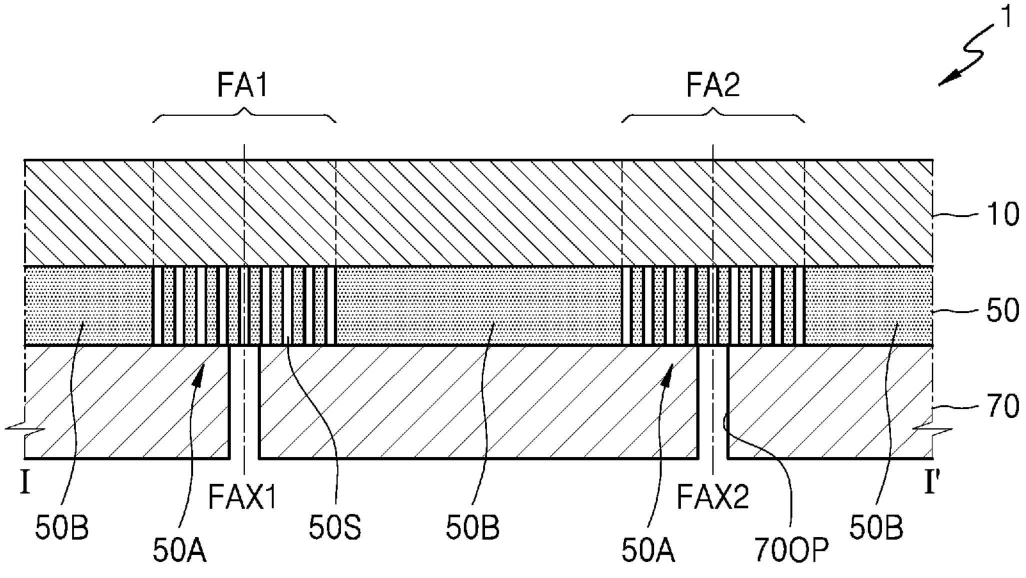
FIG. 6 is a cross-sectional view schematically illustrating a portion of a display apparatus according to an embodiment.

FIG. 3 is a schematic exploded perspective view illustrating a structure of the display apparatus of FIG. 1 according to an embodiment. FIGS. 4A, 4B, 4C, and 5 are enlarged views of a portion of a support layer of FIG. 3. FIG. 6 is a cross-sectional view schematically illustrating a portion of a display apparatus according to an embodiment. FIG. 4A is an enlarged view of region B of the support layer of FIG. 3. FIG. 4B is an enlarged view of the encircled portion of FIG. 4A. FIG. 4C illustrates a portion of a cross-section taken along line V-V in the support layer of FIG. 4B. FIG. 6 illustrates a portion of a cross-section taken along line I-I' in the display apparatus of FIG. 1.

Referring to FIG. 3, an embodiment of the display apparatus 1 may include a display panel 10, a support layer 50, and a lower cover 90.

The display panel 10 may include a display area DA and a peripheral area PA. The display area DA may include a first display area DA1 and a second display area DA2. At least one folding area and at least one non-folding area may be defined in the display panel 10. At least one folding area may correspond to the first display area DA1, and at least one non-folding area may correspond to the second display area DA2.

The first display area DA1 may include a first folding area FA1 and a second folding area FA2. The second display area DA2 may include a first non-folding area NFA1, a second non-folding area NFA2, and a third non-folding area NFA3.

The first display area DA1 and the second display area DA2 may be surrounded by the peripheral area PA.

As illustrated in FIG. 6, the support layer 50 may be arranged under the display panel 10 to support the display panel 10. The support layer 50 may include a plurality of first areas 50A and a plurality of second areas 50B. The first areas 50A and the second areas 50B may be integrally formed with each other as a single unitary and indivisible part. The first areas 50A may respectively correspond to (overlap) the first folding area FA1 and the second folding area FA2 of the display panel 10. The second areas 50B may respectively correspond to (overlap) the first non-folding area NFA1, the second non-folding area NFA2, and the third non-folding area NFA3 of the display panel 10. The first area 50A may be located between the second areas 50B.

The support layer 50 may have various structures depending on whether the display apparatus 1 is folded and folding forms thereof. In an embodiment, for example, when the display apparatus 1 is not folded, the support layer 50 may have a flat top surface without being changed in shape. In an embodiment, when the display apparatus 1 is folded, the support layer 50 may be folded together with the display panel 10. The first areas 50A may be respectively folded with respect to the first folding axis FAX1 and the second folding axis FAX2.

Each of the first areas 50A may include a plurality of slits 50S to have a certain pattern. The plurality of slits 50S may be arranged in the y direction (a lengthwise direction or a first direction) and the x direction (a widthwise direction or a second direction) perpendicular to the y direction. The plurality of slits 50S may have a length l in the y direction parallel to the folding axis of the folding area. In an embodiment, for example, the plurality of slits 50S may have an elliptical slit shape in the y direction.

In an embodiment, as illustrated in FIGS. 4A, 4B and 4C, each of the first areas 50A may include a grid pattern in which a plurality of slits 50S of a same length is arranged apart from each other in the y direction and the x direction. A width lw of a rib (grid line) 50P of the grid pattern may be determined by a first distance d1 in the x direction and a second distance d2 in the y direction between the slits 50S. The plurality of slits 50S may be arranged at regular or irregular intervals in the y direction and/or the x direction. The plurality of slits 50S may have a same shape as each other or different shapes from each other. The degree of flexibility of the first area 50A may be determined by at least one of the length l and the width sw of the slit 50S and the first distance d1 and the second distance d2 between the slits 50S. In an alternative embodiment, as illustrated in FIG. 5, each of the first areas 50A may include a slit pattern in which a plurality of slits 50S of a same length is arranged in parallel to and apart from each other in the x direction. Ribs 50P and slits 50S of the slit pattern may alternate with each other in the x direction. Here, a rib 50P of the support layer 50 may be defined by a portion thereof between adjacent slits 50S.

The support layer 50 may include at least one selected from glass, plastic, and metal. In an embodiment, the support layer 50 may include polyurethane or carbon fiber reinforced plastic. In an embodiment, the support layer 50 may include at least one selected from stainless steel, invar, nickel (Ni), cobalt (Co), nickel alloy, and nickel-cobalt alloy. In an embodiment, the support layer 50 may include austenitic stainless steels.

As illustrated in FIG. 6, a cushion layer 70 may be disposed under the support layer 50. The cushion layer 70 may prevent or minimize the damage to the support layer 50 and the display panel 10 disposed on the cushion layer 70 due to an external impact. In an embodiment, an opening 700P may be defined through the cushion layer 70 with respect to the folding axis.

The lower cover 90 may form the external shape of the bottom surface of the display apparatus 1. The lower cover 90 may include plastic, metal, or both plastic and metal. The lower cover 90 may include hinge areas 90A overlapping the first display areas DA1, which are the folding areas of the display panel 10, and the first areas 50A of the support layer 50, and other planar portions 90B. The planar portions 90B may overlap the second display areas DA2, which are the non-folding areas of the display panel 10, and the second areas 50B of the support layer 50. The hinge areas 90A of the lower cover 90 may be respectively folded with respect to the first folding axis FAX1 and the second folding axis FAX2.

Figure 7:
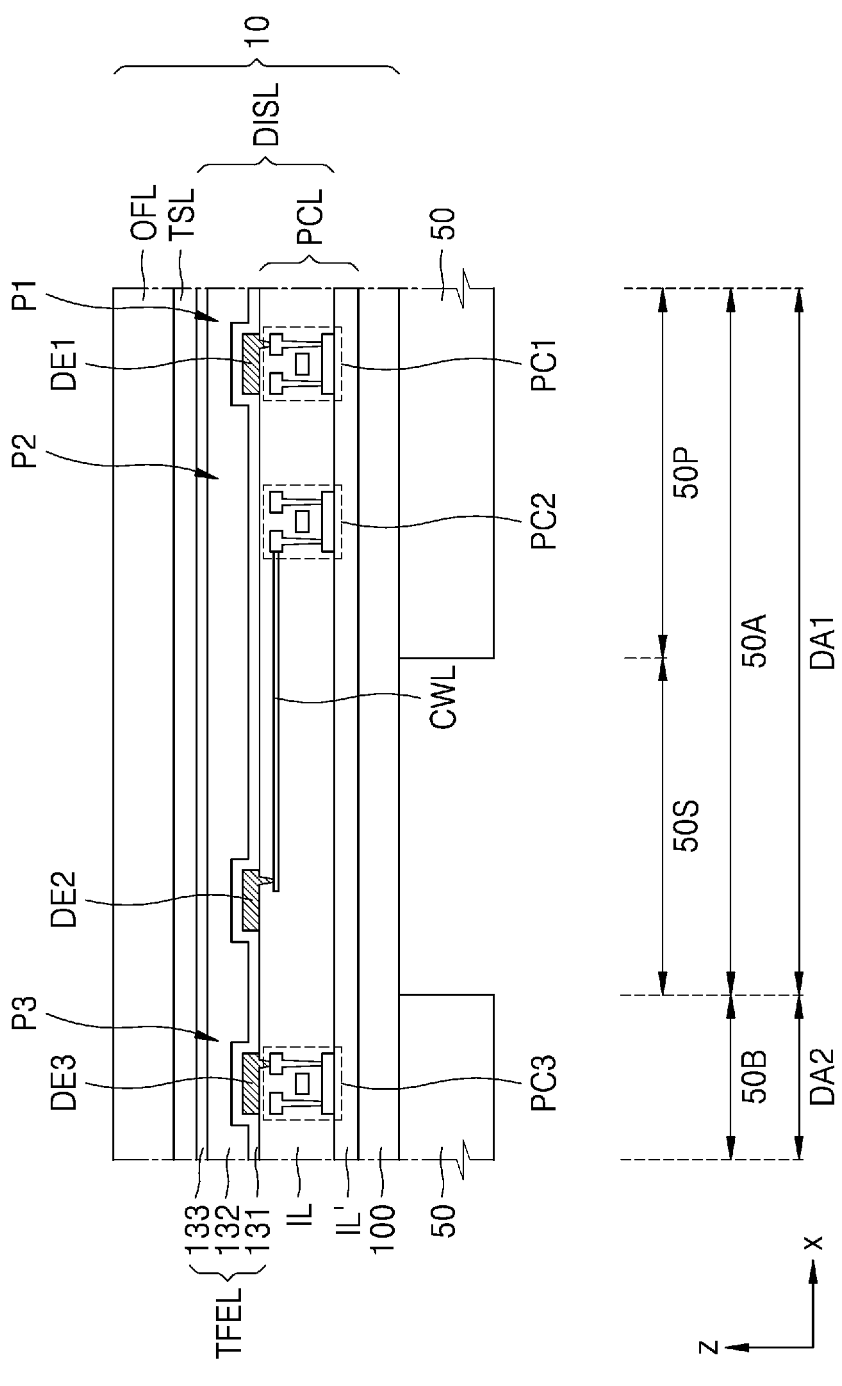
FIG. 7 is a cross-sectional view schematically illustrating a portion of a display apparatus according to an embodiment.

FIG. 7 is a cross-sectional view schematically illustrating a portion of a display apparatus according to an embodiment.

Referring to FIG. 7, an embodiment of the display apparatus 1 may include a display panel 10 and a support layer 50 overlapping the display panel 10. A cover window (not illustrated) for protecting the display panel 10 may be further disposed over the display panel 10.

The display panel 10 may include a substrate 100, a display layer DISL on the substrate 100, a touch sensor layer TSL, and an optical functional layer OFL. The display panel 10 may include a first display area DA1 and a second display area DA2. The first display area DA1 may be a folding area, and one or more folding areas may be provided. The second display area DA2 may be a non-folding area that is not foldable (non-foldable).

The substrate 100 may include an insulating material such as glass, quartz, or polymer resin. The substrate 100 may include a flexible substrate capable of bending, folding, rolling, or the like.

The display layer DISL may include a circuit layer PCL, display elements disposed on the circuit layer PCL, and an encapsulation layer such as a thin film encapsulation layer TFEL or an encapsulation substrate (not illustrated). Insulating layers IL and IL' may be arranged in the display layer DISL and between the substrate 100 and the display layer DISL. In an embodiment, the display elements may be an organic light emitting diode including an organic emission layer. Alternatively, the display elements may be a light emitting diode (LED). The size of the LED may be a micro scale or a nano scale. In an embodiment, for example, the LED may be a micro LED. Alternatively, the light emitting diode may be a nanorod LED. The nanorod LED may include gallium nitride (GaN). In an embodiment, a color conversion layer may be disposed on the nanorod LED. The color conversion layer may include quantum dots. Alternatively, the display element may be a quantum dot LED including a quantum dot emission layer.

Alternatively, the display element may be an inorganic LED including an inorganic semiconductor.

The first display area DA1 of the display panel 10 may correspond to a first area 50A of the support layer 50, and the second display area DA2 of the display panel 10 may correspond to a second area 50B of the support layer 50.

A first pixel P1 and a second pixel P2 may be arranged in the first display area DA1. The first pixel P1 may include a first pixel circuit PC1 arranged corresponding to (overlapping) a rib 50P of the first area 50A and a first display element DE1 connected thereto. The first pixel circuit PC1 may include at least one thin film transistor and may control the light emission of the first display element DE1. The second pixel P2 may include a second pixel circuit PC2 arranged corresponding to (overlapping) a rib 50P of the first area 50A and a second display element DE2 connected thereto and arranged corresponding to (overlapping) a slit 50S. That is, the second pixel circuit PC2 may not be arranged in an area corresponding to a slit 50S of the first display area DA1. The second pixel circuit PC2 may include at least one thin film transistor and may control the light emission of the second display element DE2. The second pixel circuit PC2 may be connected to the second display element DE2 by a connection line CWL. The connection line CWL may overlap the rib 50P and the slit 50S of the first area 50A.

A third pixel P3 may be arranged in the second display area DA2 of the display panel 10. The third pixel P3 may include a third pixel circuit PC3 and a third display element DE3 connected thereto. The third pixel circuit PC3 may include at least one thin film transistor and may control the light emission of the third display element DE3.

The encapsulation layer may be disposed on the display elements. In an embodiment, the display elements may be covered by the thin film encapsulation layer TFEL or the encapsulation substrate.

In an embodiment, the thin film encapsulation layer TFEL may include at least one inorganic encapsulation layer and at least one organic encapsulation layer. In an embodiment, the thin film encapsulation layer TFEL may include a first inorganic encapsulation layer 131, an organic encapsulation layer 132, and a second inorganic encapsulation layer 133 that are sequentially stacked one on another. The first inorganic encapsulation layer 131 and the second inorganic encapsulation layer 133 may include one or more inorganic insulating materials such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), or hafnium oxide ($HfO_2$). The organic encapsulation layer 132 may include a polymer-based material. The polymer-based material may include silicon-based resin, acryl-based resin, epoxy-based resin, polyimide, polyethylene, or the like.

In an alternative embodiment, the encapsulation substrate may be arranged to face the substrate 100 with the display elements therebetween. The substrate 100 and the encapsulation substrate may be coupled by an encapsulation member such that the internal space between the substrate 100 and the encapsulation substrate may be encapsulated. The encapsulation substrate may be a flexible substrate. In an embodiment, the encapsulation member may include a sealant, or the encapsulation member may include a material that is cured by laser. In an embodiment, for example, the encapsulation member may include frit.

The touch sensor layer TSL may be configured to obtain coordinate information according to an external input, for example, a touch event. The touch sensor layer TSL may include a touch electrode and sensing lines connected to the touch electrode. The touch sensor layer TSL may sense an external input by using a self capacitance method or a mutual capacitance method. The touch sensor layer TSL may be formed on the thin film encapsulation layer TFEL. Alternatively, the touch sensor layer TSL may be separately formed over a touch substrate and then coupled onto the thin film encapsulation layer TFEL through an adhesive layer such as an optical clear adhesive (OCA). In an embodiment, the touch sensor layer TSL may be directly formed over the thin film encapsulation layer TFEL, and in such an embodiment, an adhesive layer may not be arranged between the touch sensor layer TSL and the thin film encapsulation layer TFEL.

The optical functional layer OFL may include an anti-reflection layer. The anti-reflection layer may be configured to reduce the reflectance of light (external light) incident from the outside toward the display apparatus 1. In some embodiments, the optical functional layer OFL may include a polarization film. In some embodiments, the optical functional layer OFL may be a filter support plate including a black matrix and color filters.

Figure 8A:
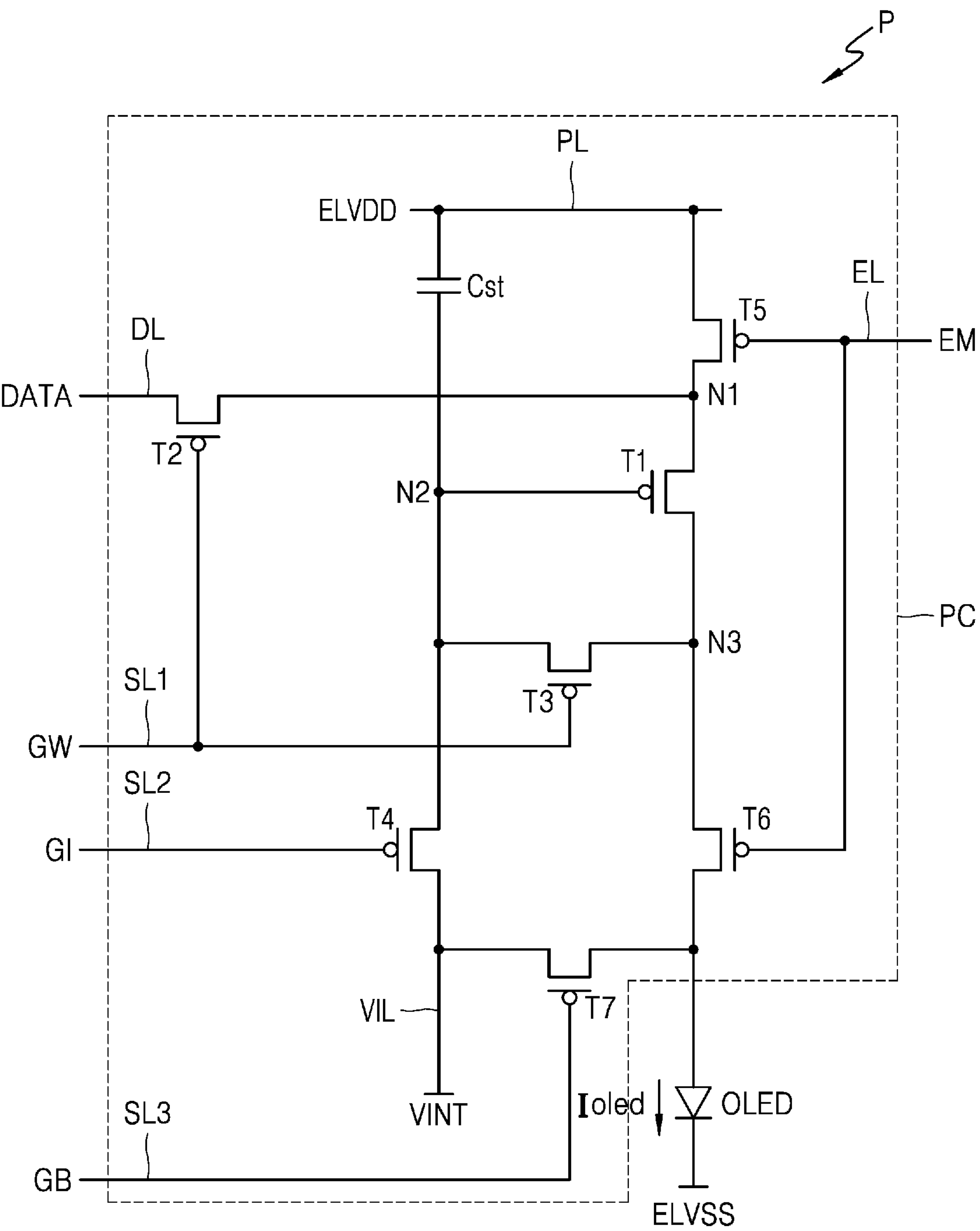
FIGS. 8A and 8B are respectively equivalent circuit diagrams schematically illustrating a pixel circuit arranged in a display panel.
Figure 8B:
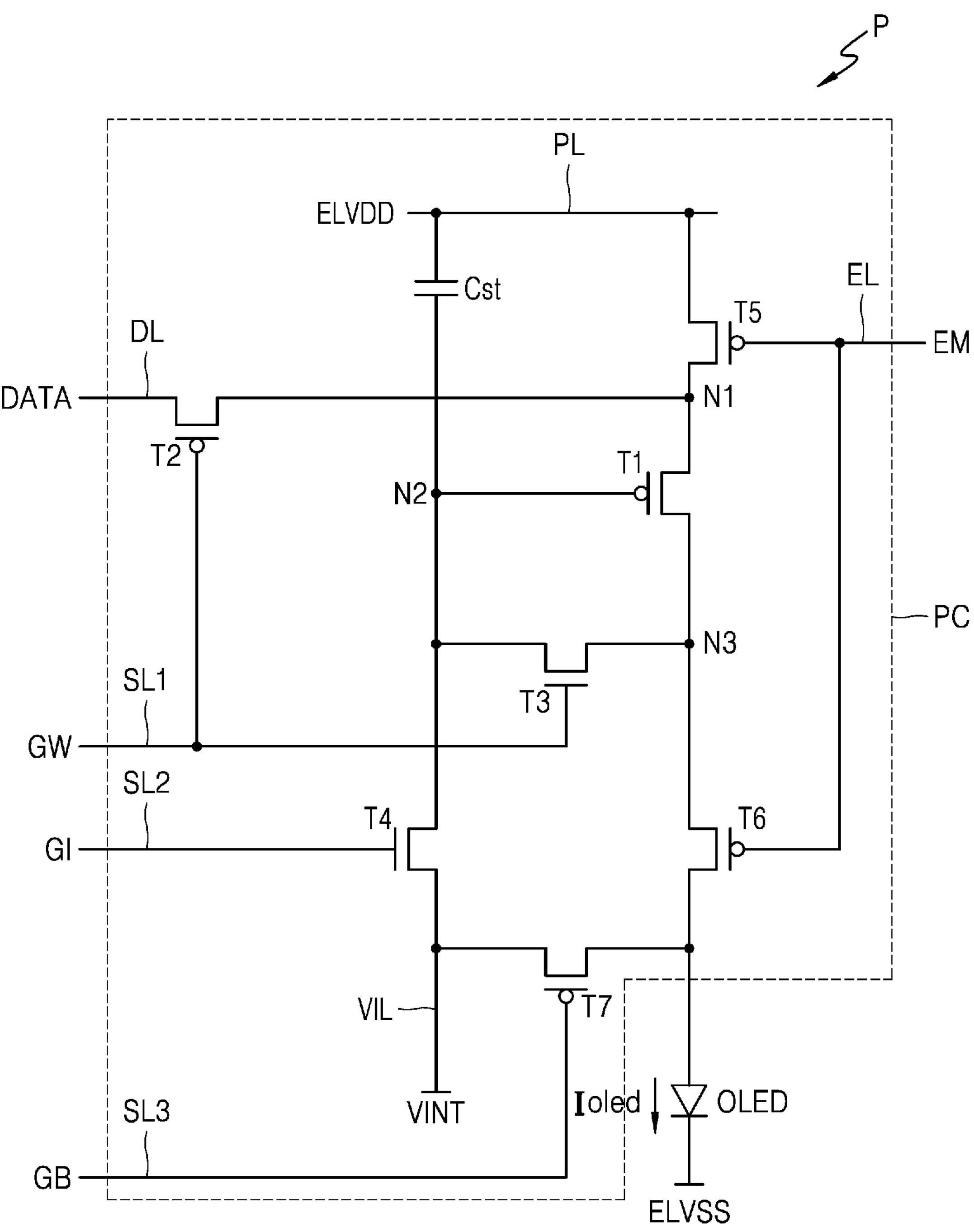

FIGS. 8A and 8B are respectively equivalent circuit diagrams schematically illustrating a pixel circuit arranged in a display panel. A pixel circuit PC of a pixel P illustrated in FIGS. 8A and 8B may correspond to a first pixel circuit PC1 of a first pixel P1, a second pixel circuit PC2 of a second pixel P2, and a third pixel circuit PC3 of a third pixel P3. Hereinafter, for convenience of description, the first pixel circuit PC1, the second pixel circuit PC2, and the third pixel circuit PC3 will be referred to as a pixel circuit PC.

Referring to FIG. 8A, the pixel circuit PC may include first to seventh transistors T1 to T7. Depending on the type (N type or P type) and/or the operation condition of the transistor, a first terminal of the transistor may be one of a source electrode and a drain electrode, and a second terminal of the transistor may be the other of the source electrode and the drain electrode. In an embodiment, for example, where the first terminal is a source electrode, the second terminal may be a drain electrode.

The pixel circuit PC may be connected to a first scan line SL1 configured to transmit a first scan signal GW, a second scan line SL2 configured to transmit a second scan signal GI, a third scan line SL3 configured to transmit a third scan signal GB, an emission control line EL configured to transmit an emission control signal EM, a data line DL configured to transmit a data signal DATA, a driving voltage line PL configured to transmit a driving voltage ELVDD, and an initialization voltage line VIL configured to transmit an initialization voltage VINT. The pixel circuit PC may be connected to an organic light emitting diode OLED which is a display element.

The first transistor T1 may be connected between the driving voltage line PL and the organic light emitting diode OLED. The first transistor T1 may be connected between a first node N1 and a third node N3. The first transistor T1 may be connected to the driving voltage line PL via the fifth transistor T5 and may be electrically connected to the organic light emitting diode OLED via the sixth transistor T6. The first transistor T1 may include a gate electrode connected to a second node N2, a first terminal connected to the first node N1, and a second terminal connected to the third node N3. The driving voltage line PL may be configured to transmit the driving voltage ELVDD to the first transistor T1. The first transistor T1 may function as a driving transistor and may receive the data signal DATA based on a switching operation of the second transistor T2 to supply a driving current Ioled to the organic light emitting diode OLED.

The second transistor T2 (a data writing transistor) may be connected between the data line DL and the first node N1. The second transistor T2 may be connected to the driving voltage line PL via the fifth transistor T5. The second transistor T2 may include a gate electrode connected to the first scan line SL1, a first terminal connected to the data line DL, and a second terminal connected to the first node N1. The second transistor T2 may be turned on in response to the first scan signal GW received through the first scan line SL1, to perform a switching operation of transmitting the data signal DATA received through the data line DL to the first node N1.

The third transistor T3 (a compensation transistor) may be connected between the second node N2 and the third node N3. The third transistor T3 may be connected to the organic light emitting diode OLED via the sixth transistor T6. The third transistor T3 may include a gate electrode connected to the first scan line SL1, a first terminal connected to the second node N2, and a second terminal connected to the third node N3. The third transistor T3 may be turned on in response to the first scan signal GW received through the first scan line SL1 to diode-connect the first transistor T1 to compensate for the threshold voltage of the first transistor T1.

The fourth transistor T4 (a first initialization transistor) may be connected between the second node N2 and the initialization voltage line VIL. The fourth transistor T4 may include a gate electrode connected to the second scan line SL2, a first terminal connected to the second node N2, and a second terminal connected to the initialization voltage line VIL. The fourth transistor T4 may be turned on in response to the second scan signal GI received through the second scan line SL2 to transmit the initialization voltage VINT to the gate electrode of the first transistor T1 to initialize the gate electrode of the first transistor T1.

The fifth transistor T5 (a first emission control transistor) may be connected between the driving voltage line PL and the first node N1. The sixth transistor T6 (a second emission control transistor) may be connected between the third node N3 and the organic light emitting diode OLED. The fifth transistor T5 may include a gate electrode connected to the emission control line EL, a first terminal connected to the driving voltage line PL, and a second terminal connected to the first node N1. The sixth transistor T6 may include a gate electrode connected to the emission control line EL, a first terminal connected to the third node N3, and a second terminal connected to a pixel electrode of the organic light emitting diode OLED. The fifth transistor T5 and the sixth transistor T6 may be simultaneously turned on in response to the emission control signal EM received through the emission control line EL and thus a driving current may flow through the organic light emitting diode OLED.

The seventh transistor T7 (a second initialization transistor) may be connected between the organic light emitting diode OLED and the initialization voltage line VIL. The seventh transistor T7 may include a gate electrode connected to the third scan line SL3, a first terminal connected to the second terminal of the sixth transistor T6 and the pixel electrode of the organic light emitting diode OLED, and a second terminal connected to the initialization voltage line VIL. The seventh transistor T7 may be turned on in response to the third scan signal GB received through the third scan line SL3 to transmit the initialization voltage VINT to the pixel electrode of the organic light emitting diode OLED to initialize the pixel electrode of the organic light emitting diode OLED.

A capacitor Cst may include a first electrode connected to the gate electrode of the first transistor T1 and a second electrode connected to the driving voltage line PL. The capacitor Cst may store and maintain a voltage corresponding to the voltage difference between the driving voltage line PL and the gate electrode of the first transistor T1 to maintain a voltage applied to the gate electrode of the first transistor T1.

The organic light emitting diode OLED may include a pixel electrode (a first electrode or an anode) and an opposite electrode (a second electrode or a cathode) facing the pixel electrode, and the opposite electrode may receive a common voltage ELVSS. The organic light emitting diode OLED may receive a driving current from the first transistor T1 to emit light to display an image.

FIG. 8A illustrates that an embodiment where the first to seventh transistors T1 to T7 are P-type transistors. However, the embodiments are not limited thereto. In an alternative embodiment, for example, the first to seventh transistors T1 to T7 may be N-type transistors, or some of the first to seventh transistors T1 to T7 may be N-type transistors and the others may be P-type transistors. FIG. 8B illustrates an embodiment where the third transistor T3 and the fourth transistor T4 among the first to seventh transistors T1 to T7 are N-type transistors and the other transistors are P-type transistors. In such an embodiment, the third transistor T3 and the fourth transistor T4 may include a semiconductor layer including an oxide, and the other transistors may include a semiconductor layer including silicon.

In an embodiment, a display element may be an organic light emitting diode, as described above, but not being limited thereto. Alternatively, an inorganic light emitting device or a quantum dot light emitting device may be used as a display element.

Figure 9:
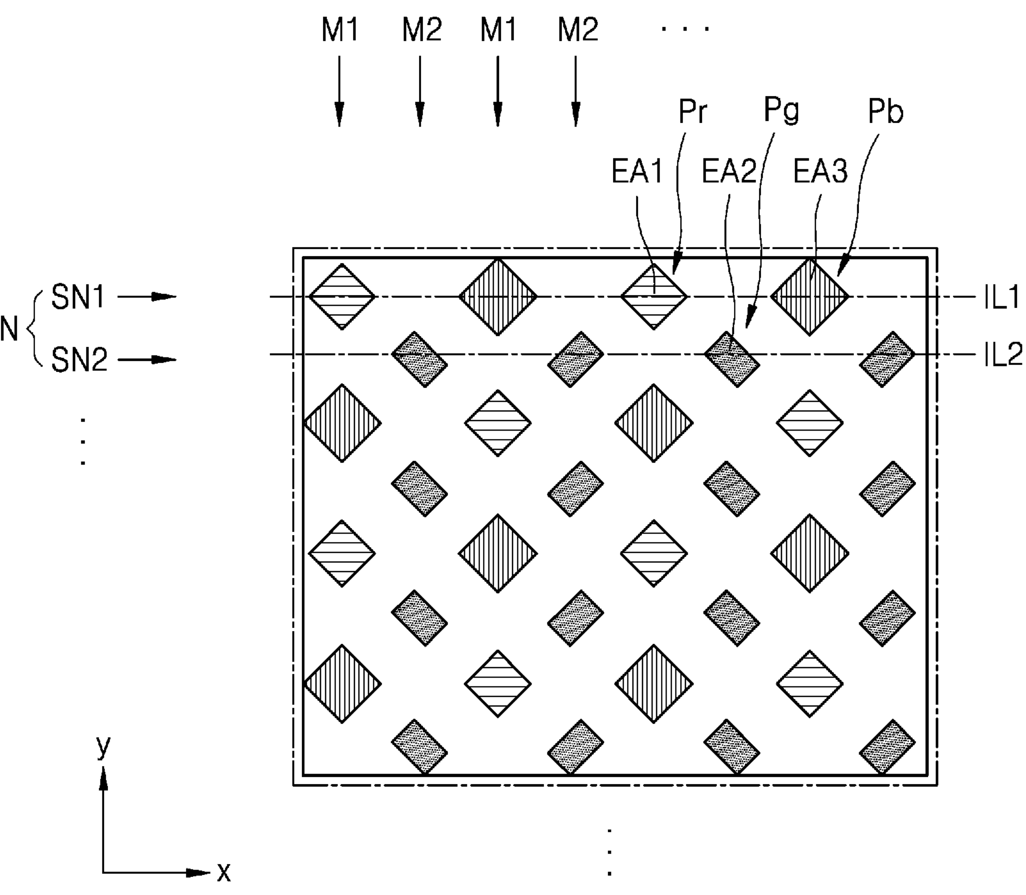
FIG. 9 is a diagram illustrating a schematic arrangement of emission areas of a plurality of pixels arranged in a display area, according to an embodiment.

FIG. 9 is a diagram illustrating a schematic arrangement of emission areas of a plurality of pixels arranged in a display area, according to an embodiment.

Referring to FIG. 9, a plurality of pixels arranged in the display area DA may include a first subpixel Pr that emits light in a first color, a second subpixel Pg that emits light in a second color, and a third subpixel Pb that emits light in a third color. In an embodiment, the first subpixel Pr may be a red pixel that emits red light, the second subpixel Pg may be a green pixel that emits green light, and the third subpixel Pb may be a blue pixel that emits blue light.

In the first display area DA1 and the second display area DA2, the first subpixel Pr, the second subpixel Pg, and the third subpixel Pb may be repeatedly arranged according to a certain pattern in the x direction and the y direction. Each of the first subpixel Pr, the second subpixel Pg, and the third subpixel Pb may include a pixel circuit and a display element electrically connected to the pixel circuit. In an embodiment, the display element may be an organic light emitting diode OLED.

An emission area of each of the first subpixel Pr, the second subpixel Pg, and the third subpixel Pb may be an area in which an emission layer of the organic light emitting diode OLED is arranged. The emission area may be defined by an opening of a pixel definition layer. This will be described below.

In a first column M1, a first emission area EA1 of the first subpixel Pr and a third emission area EA3 of the third subpixel Pb may be alternately arranged in they direction. In a second column M2, a second emission area EA2 of the second subpixel Pg may be repeatedly arranged in the y direction. The first column M1 and the second column M2 may alternate with each other in the x direction, and the arrangements of the first emission area EA1 of the first subpixel Pr and the third emission area EA3 of the third subpixel Pb in the first columns M1 adjacent to each other may be opposite to each other.

In a first sub-row SN1 of each row N, the first emission area EA1 of the first subpixel Pr and the third emission area EA3 of the third subpixel Pb may be alternately arranged in the x direction along a first imaginary line IL1, and in a second sub-row SN2 thereof, the second emission area EA2 of the second subpixel PX2 may be repeatedly arranged in the x direction along a second imaginary line IL2. That is, in each row N, the first emission area EA1 of the first subpixel Pr, the second emission area EA2 of the second subpixel Pg, the third emission area EA3 of the third subpixel Pb, and the second emission area EA2 of the second subpixel Pg may be repeatedly arranged in a zigzag manner.

The first emission area EA1 of the first subpixel Pr, the second emission area EA2 of the second subpixel Pg, and the third emission area EA3 of the third subpixel Pb may have different areas from each other. In an embodiment, the third emission area EA3 of the third subpixel Pb may have a greater area than the first emission area EA1 of the first subpixel Pr. Also, the third emission area EA3 of the third subpixel Pb may have a greater area than the second emission area EA2 of the second subpixel Pg. The first emission area EA1 of the first subpixel Pr may have a greater area than the second emission area EA2 of the second subpixel Pg. In an alternative embodiment, the third emission area EA3 of the third subpixel Pb may have a same area as the first emission area EA1 of the first subpixel Pr. However, the disclosure is not limited thereto. For example, in various other embodiments, the first emission area EA1 of the first subpixel Pr may be larger than the second emission area EA2 of the second subpixel Pg and the third emission area EA3 of the third subpixel Pb.

The first to third emission areas EA1, EA2, and EA3 may have shapes such as polygonal shapes (such as tetragonal shapes or octagonal shapes), circular shapes, or elliptical shapes, and the polygonal shapes may also include shapes with rounded corners (vertexes).

Figure 10:
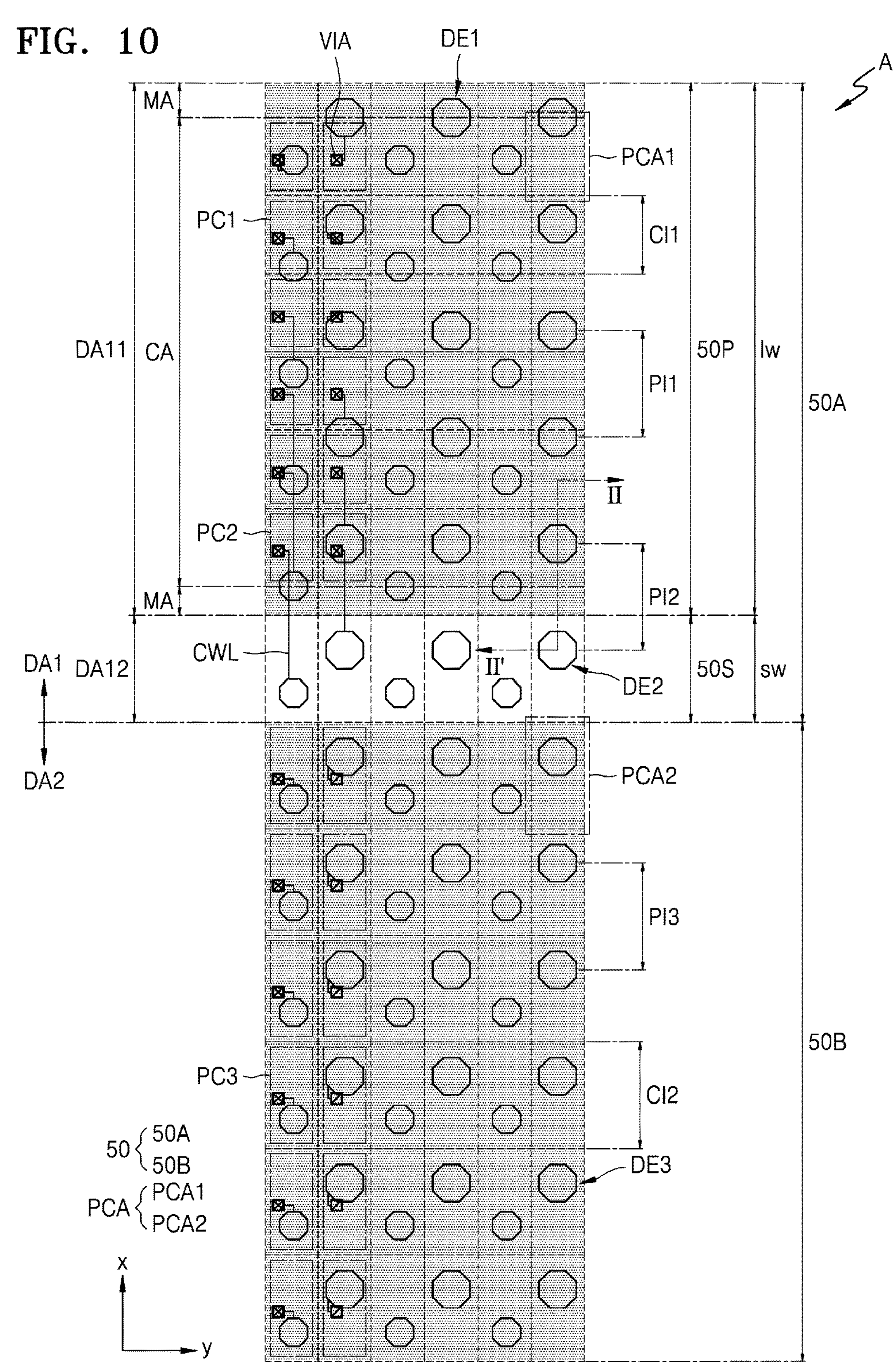
FIG. 10 is a diagram illustrating a connection between a pixel circuit and a display element in a first display area and a second display area, according to an embodiment.

FIG. 10 is a diagram illustrating a connection between a pixel circuit and a display element in a first display area and a second display area, according to an embodiment. FIG. 10 is a diagram schematically illustrating a portion of the display panel corresponding to region A of FIG. 1.

Referring to FIG. 10, the display area DA of the display panel 10 may include a plurality of pixel areas PCA. The plurality of pixel areas PCA may be repeatedly arranged in the x direction and the y direction. The pixel area PCA may be an area in which a pixel circuit of one pixel and signal lines connected to the pixel circuit are arranged. The pixel areas PCA may include first pixel areas PCA1 of the first display area DA1 and second pixel areas PCA2 of the second display area DA2. The display element may be disposed in a layer over the pixel circuit. The display element may be disposed directly over the pixel circuit to overlap the pixel circuit or may be arranged to partially overlap a pixel circuit of another pixel arranged in an adjacent row and/or column by being offset from the pixel circuit. In an embodiment, the display element may be an organic light emitting diode OLED.

In the display panel 10, the first display area DA1 may correspond to (overlap) the first area 50A of the support layer 50. The first display area DA1 may include a rib corresponding area DA11 and a slit corresponding area DA12. The rib corresponding area DA11 may correspond to (overlap) the rib 50P of the first area 50A of the support layer 50. The rib corresponding area DA11 may be an area corresponding to (overlapping) the rib 50P of the support layer 50. The slit corresponding area DA12 may correspond to (overlap) the slit 50S of the first area 50A of the support layer 50. In the display panel 10, the rib corresponding area DA11 may have a size corresponding to the width lw of the rib 50P of the support layer 50. In an embodiment, for example, in the display panel 10, the x-direction length of the rib corresponding area DA11 may correspond to the width lw of the rib 50P of the support layer 50. In the display panel 10, the x-direction length of the slit corresponding area DA12 may correspond to the width sw of the slit 50S of the support layer 50.

First display elements DE1 may be arranged in the rib corresponding area DA11. Second display elements DE2 may be arranged in the slit corresponding area DA12. The number of first display elements DE1 arranged in the rib corresponding area DA11 in the x direction may be determined based on the width lw of the rib 50P of the support layer 50. The number of second display elements DE2 arranged in the slit corresponding area DA12 in the x direction may be determined based on the width sw of the slit 50S of the support layer 50. In an embodiment, for example, as shown in FIG. 10, second display elements DE2 are arranged in they direction along one row in the slit corresponding area DA12; however, this is merely an example, and the slit corresponding area DA12 may include two or more rows and second display elements DE2 may be arranged in the y direction in each row.

A first pixel circuit PC1 connected to the first display element DE1 and a second pixel circuit PC2 connected to the second display element DE2 may be arranged in the rib corresponding area DA11. The rib corresponding area DA11 may include a circuit area CA in which the first pixel circuit PC1 and the second pixel circuit PC2 are arranged, and a margin area MA between the circuit area CA and the slit corresponding area DA12. The margin area MA may overlap the rib 50P of the support layer 50 and may be an area in which a pixel circuit is not arranged. The circuit area CA may include a plurality of first pixel areas PCA1. A first pixel circuit PC1 or a second pixel circuit PC2 may be arranged in the first pixel area PCA1. Some of the first display elements DE1 may overlap the first pixel circuit PC1. Some of the first display elements DE1 may overlap the second pixel circuit PC2. In an embodiment, the first display element DE1 may be disposed directly over the first pixel circuit PC1 to overlap the first pixel circuit PC1 connected thereto or may be arranged to at least partially overlap another first pixel circuit PC1 or second pixel circuit PC2 arranged in an adjacent row and/or column by being offset from the first pixel circuit PC1 connected thereto.

The second display area DA2 may overlap the second area 50B of the support layer 50. A third pixel circuit PC3 connected to the third display element DE3 may be arranged in the second display area DA2. The second display area DA2 may include a plurality of second pixel areas PCA2. The size of the second pixel area PCA2 may be greater than the size of the first pixel area PCA1. In an embodiment, for example, the size (e.g., a length in the x direction) of the second pixel area PCA2 may be greater than the size of the first pixel area PCA1. A third pixel circuit PC3 may be arranged in the second pixel area PCA2. The third display element DE3 may overlap the third pixel circuit PC3. In an embodiment, the third display element DE3 may be disposed directly over the third pixel circuit PC3 to overlap the third pixel circuit PC3 connected thereto or may be arranged to at least partially overlap another third pixel circuit PC3 arranged in an adjacent row and/or column by being offset from the third pixel circuit PC3 connected thereto.

A distance P11 between the first display elements DE1 of the subpixels adjacent in the x direction in the first display area DA1, a distance PI2 between the first display element DE1 and the second display element DE2 of the subpixels adjacent in the x direction, and a distance PI3 between the third display elements DE3 of the subpixels adjacent in the x direction in the second display area DA2 may be equal to each other. in an embodiment where the second display elements DE2 are arranged in two or more rows in the slit corresponding area DA12, the distance between the second display elements DE2 of the subpixels adjacent in the x direction may be equal to the distance PI3 between the third display elements DE3 of the subpixels adjacent in the x direction in the second display area DA2.

In the first display area DA1, the x-direction pitch between the adjacent first pixel circuits PC1 and the x-direction pitch between the adjacent second pixel circuits PC2 may be less than the x-direction pitch between the third pixel circuits PC3. The arrangement of the first pixel circuits PC1 and the second pixel circuits PC2 in the x direction and/or the y direction may be different from the arrangement of the third pixel circuits PC3 in the x direction and/or the y direction. Accordingly, the x-direction size of the first pixel circuit PC1 and the second pixel circuit PC2 may be reduced compared to the x-direction size of the third pixel circuit PC3, and an x-direction length CI1 of the first pixel area PCA1 may be less than an x-direction length CI2 of the second pixel area PCA2.

Figure 11:
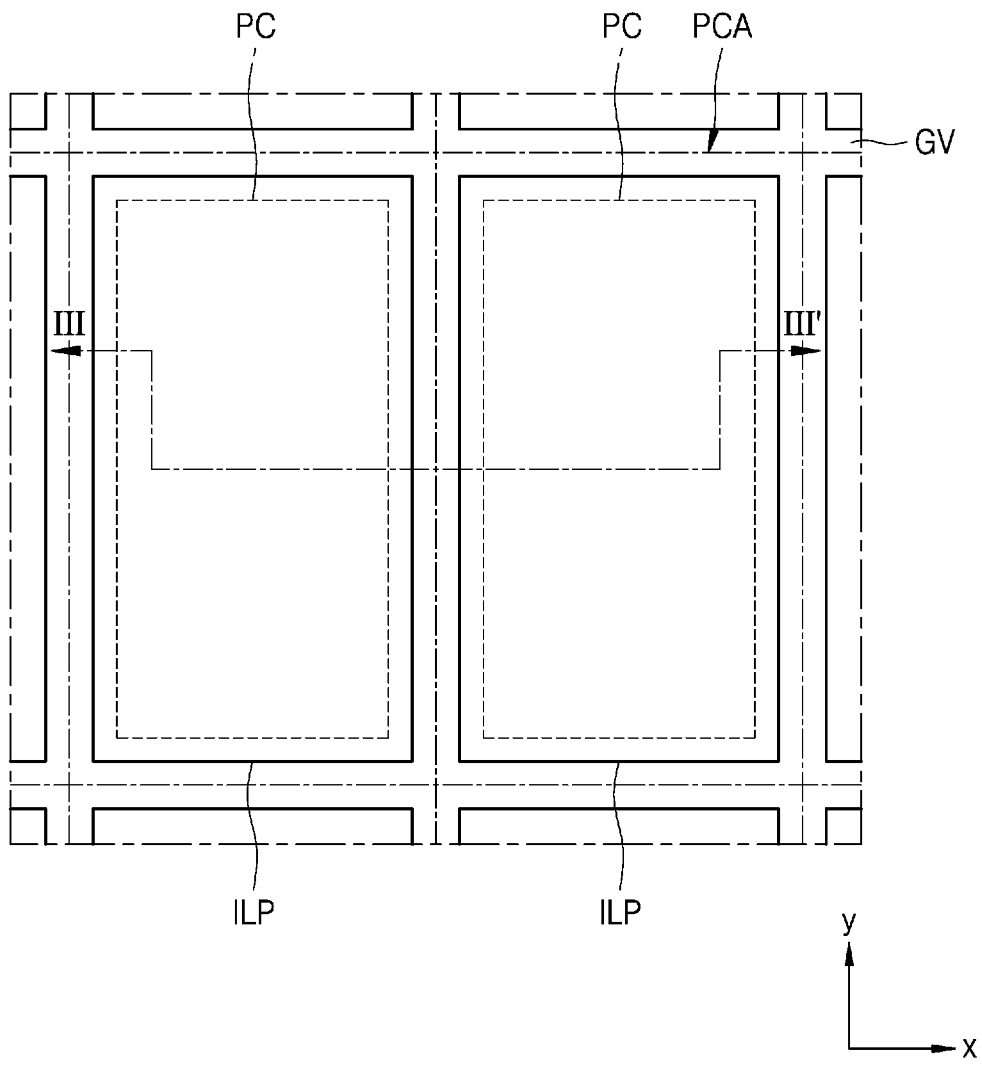
FIG. 11 is a diagram schematically illustrating pixel areas of a display panel according to an embodiment.
Figure 12:
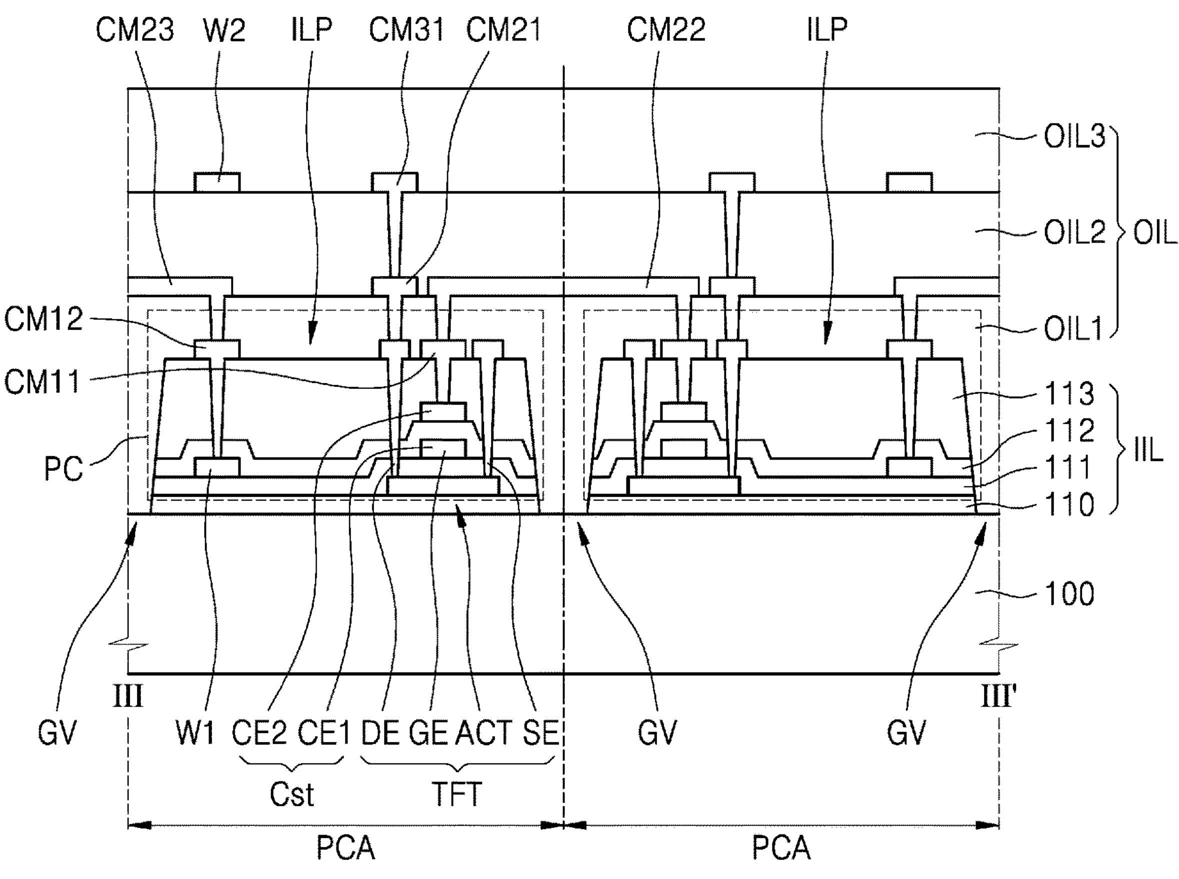
FIG. 12 is a cross-sectional view schematically illustrating a portion of the display panel of FIG. 11 taken along line III-III' in FIG. 11, according to an embodiment.
Figure 13:
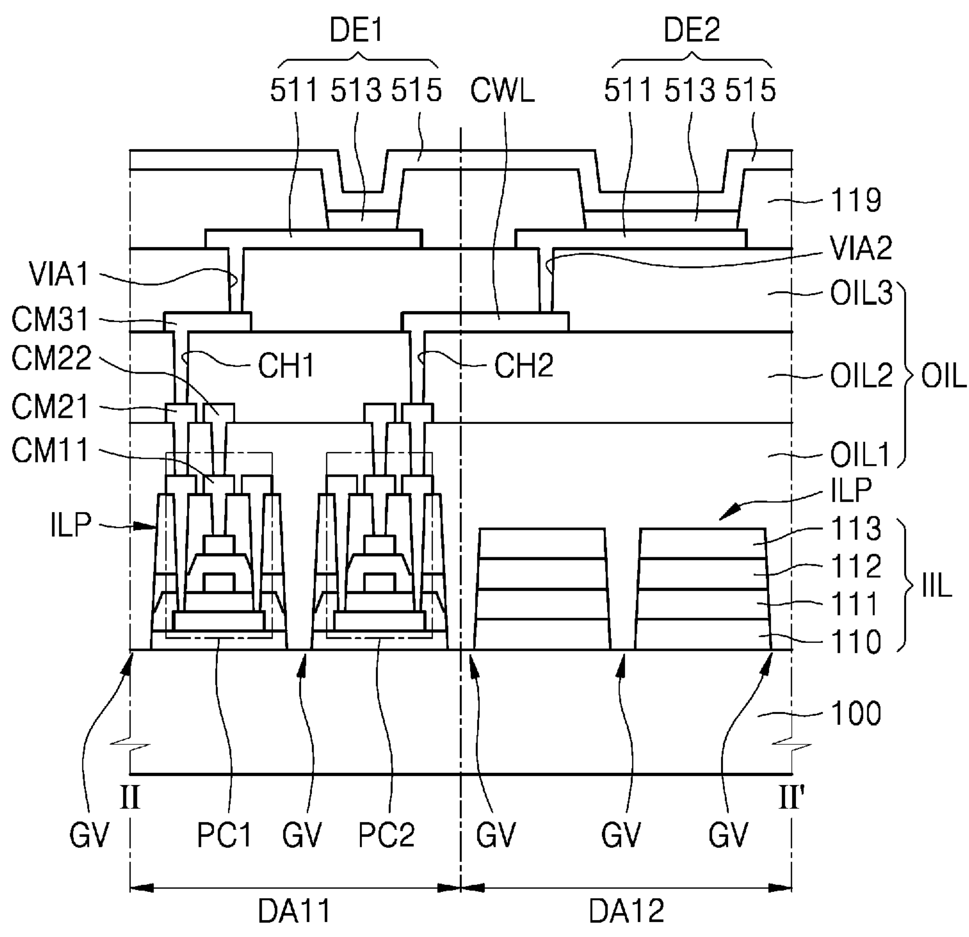
FIG. 13 is a cross-sectional view schematically illustrating a first pixel and a second pixel of a display panel according to an embodiment.
Figure 14:
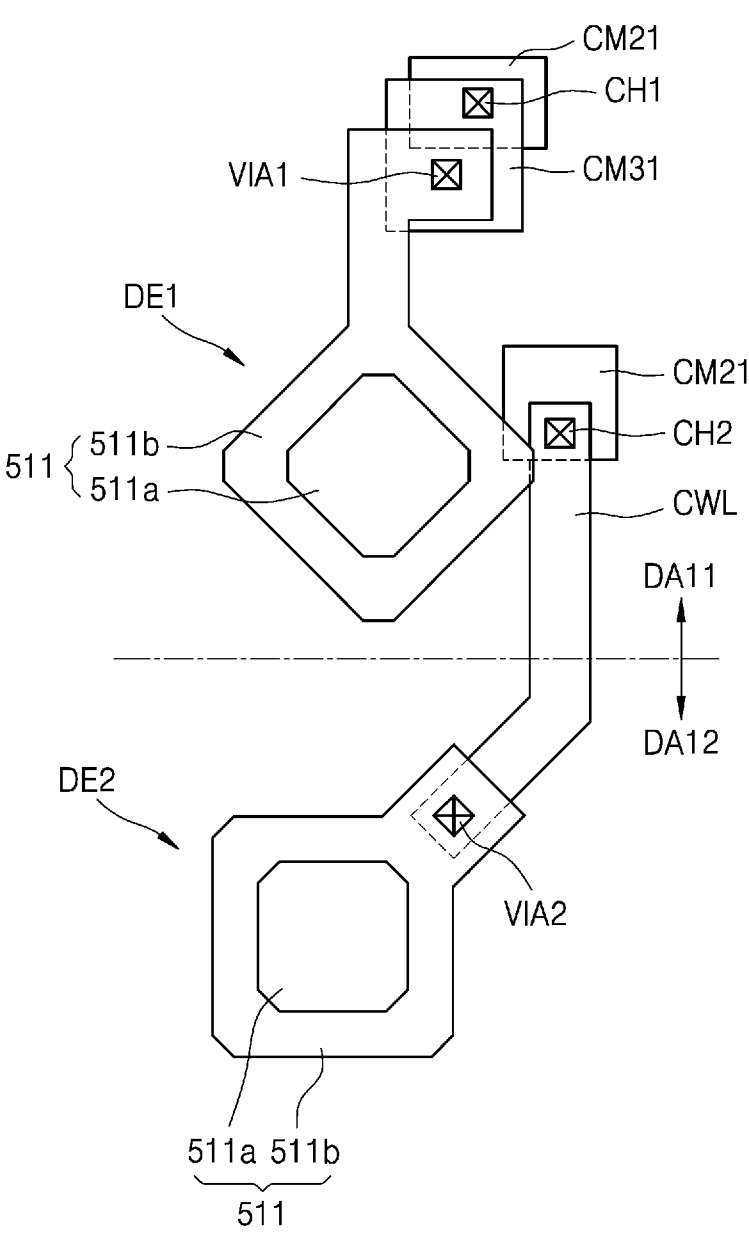
FIG. 14 is a diagram schematically illustrating a pixel electrode of a first display element and a pixel electrode of a second display element according to an embodiment.

FIG. 11 is a diagram schematically illustrating pixel areas of a display panel according to an embodiment. FIG. 11 may be a diagram schematically illustrating a portion of the pixel areas of FIG. 10. FIG. 12 is a cross-sectional view schematically illustrating a portion of the display panel of FIG. 11 taken along line III-III' in FIG. 11, according to an embodiment. FIG. 13 is a cross-sectional view schematically illustrating a first pixel and a second pixel of a display panel according to an embodiment. FIG. 13 may be a cross-sectional view schematically illustrating a portion of the display panel of FIG. 10 taken along line II-II' in FIG. 10. FIG. 14 is a diagram schematically illustrating a pixel electrode of a first display element and a pixel electrode of a second display element according to an embodiment.

Referring to FIG. 11, the display panel 10 may include a groove GV defined or formed along the boundary lines of the pixel area PCA, and an inorganic insulating pattern ILP surrounded by the groove GV. The inorganic insulating pattern ILP may include a plurality of inorganic insulating layers, and devices of the pixel circuit may be disposed on the inorganic insulating layers. Thus, it may be understood that the groove GV surrounds the pixel circuit PC.

Referring to FIG. 12, the pixel circuit PC disposed on the substrate 100 may include a thin film transistor TFT and a capacitor Cst and may be connected to signal lines such as a scan line and a data line.

The substrate 100 may include or be formed of various materials such as metal materials or plastic materials. According to an embodiment, the substrate 100 may be a flexible substrate. The substrate 100 may include a polymer resin such as polyethersulphone (PES), polyacrylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), or cellulose acetate propionate (CAP). In an embodiment, the substrate 100 may have a multilayer structure including a barrier layer and a base layer including the above polymer resin. The barrier layer may include an inorganic material such as silicon nitride ($SiN_x$) and/or silicon oxide ($SiO_2$).

A buffer layer 110 may be disposed on the substrate 100. The buffer layer 110 may include an inorganic insulating material such as silicon nitride ($SiN_x$), silicon oxynitride (SiON), and/or silicon oxide ($SiO_2$) and may be defined by a single layer or multiple layers including the inorganic insulating material.

A semiconductor layer ACT may be disposed on the buffer layer 110. The semiconductor layer ACT may include amorphous silicon, polysilicon, oxide, or organic semiconductor material. The semiconductor layer ACT may include a channel area, a source area, and a drain area. The semiconductor layer ACT may be arranged separately from a semiconductor layer ACT of an adjacent pixel area PCA for each pixel area PCA.

A first insulating layer 111 may be provided to cover the semiconductor layer ACT. The first insulating layer 111 may include an inorganic insulating material such as silicon oxide ($SiO_2$), silicon nitride ($SiN_x$), silicon oxynitride ($SiO_xN_y$), aluminum oxide ($Al_2O_3$), or titanium oxide ($TiO_2$). The first insulating layer 111 may be defined by a single layer or multiple layers including at least one selected from the above inorganic insulating materials.

A gate electrode GE may be disposed on the first insulating layer 111 to overlap the semiconductor layer ACT. At least one lower signal line W1 may be further disposed on the first insulating layer 111. In an embodiment, the lower signal line W1 may be a scan line. The gate electrode GE and the lower signal line W1 may include molybdenum (Mo), aluminum (Al), copper (Cu), titanium (Ti), or the like and may be defined by a single layer or multiple layers.

A second insulating layer 112 may cover the gate electrode GE. The second insulating layer 112 may include an inorganic insulating material such as silicon oxide ($SiO_2$), silicon nitride ($SiN_x$), silicon oxynitride ($SiO_xN_y$), aluminum oxide ($Al_2O_3$), or titanium oxide ($TiO_2$). The second insulating layer 112 may be defined by a single layer or multiple layers including at least one selected from the above inorganic insulating materials.

A capacitor Cst may be disposed on the first insulating layer 111 to overlap the gate electrode GE. The capacitor Cst may include a lower electrode CE1 and an upper electrode CE2. The second insulating layer 112 may be arranged between the lower electrode CE1 and the upper electrode CE2. The gate electrode GE may function not only as the gate electrode of the thin film transistor TFT but also as the lower electrode CE1 of the capacitor Cst. That is, the gate electrode GE and the lower electrode CE1 may be integrated with each other as a single unitary and indivisible part. The upper electrode CE2 may be disposed on the second insulating layer 112 to at least partially overlap the lower electrode CE1.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may be defined by a single layer or multiple layers including at least one selected from the above materials.

A third insulating layer 113 may cover the upper electrode CE2. The third insulating layer 113 may include silicon oxide ($SiO_2$), silicon nitride ($SiN_x$), silicon oxynitride ($SiO_xN_y$), aluminum oxide ($Al_2O_3$), titanium oxide ($TiO_2$), or the like. The third insulating layer 113 may be defined by a single layer or multiple layers including at least one selected from the above inorganic insulating materials.

A groove GV surrounding the pixel area PCA may be defined or formed in the buffer layer 110, the first insulating layer 111, the second insulating layer 112, and the third insulating layer 113. In such an embodiment, the buffer layer 110, the first insulating layer 111, the second insulating layer 112, and the third insulating layer 113 are collectively referred to as an inorganic insulating layer IIL, and a groove GV or an opening surrounding the pixel area PCA may be defined in the inorganic insulating layer IIL. The groove GV may have a shape in which a portion of the inorganic insulating layer IIL is removed. In an embodiment, due to the groove GV, the inorganic insulating layer IIL may include island-shaped inorganic insulating patterns ILP in units of the pixel area PCA.

The groove GV may be provided between adjacent pixel areas PCA and may surround the pixel areas PCA. The opening of the buffer layer 110, the opening of the first insulating layer 111, the opening of the second insulating layer 112, and the opening of the third insulating layer 113 may overlap each other. The opening of the buffer layer 110, the opening of the first insulating layer 111, the opening of the second insulating layer 112, and the opening of the third insulating layer 113 may be separately formed through separate processes or may be simultaneously formed through a same process. In an embodiment where the opening of the buffer layer 110, the opening of the first insulating layer 111, the opening of the second insulating layer 112, and the opening of the third insulating layer 113 are separately formed through separate processes, the groove GV may have a stepped structure or a stair-like shape.

In an embodiment, contact holes through which a conductive layer formed subsequent to the third insulating layer 113 contacts a lower conductive layer (e.g., a semiconductor layer, a gate electrode, an upper electrode of a capacitor, a scan line, or the like) may be formed in at least one of the first insulating layer 111, the second insulating layer 112, and the third insulating layer 113. The contact holes may be formed simultaneously with the formation of the groove GV.

A source electrode SE and a drain electrode DE may be disposed on the third insulating layer 113. The source electrode SE and the drain electrode DE may be respectively connected to the source area and the drain area of the semiconductor layer ACT through contact holes. First connection electrodes CM11 and CM12 may be further disposed on the third insulating layer 113. The first connection electrode CM11 may be connected to the upper electrode CE2 of the capacitor Cst through a contact hole. The first connection electrode CM12 may be connected to the lower signal line W1 through a contact hole. The source electrode SE, the drain electrode DE, and the first connection electrodes CM11 and CM12 may include a conductive material including molybdenum (Mo), aluminum (Al), copper (Cu), titanium (Ti), or the like and may be defined by a single layer or multiple layers including at least one selected from the above materials. In an embodiment, the source electrode SE and the drain electrode DE may have a three-layer structure of titanium, aluminum, and titanium (Ti/Al/Ti) that are sequentially arranged one on another.

A first organic insulating layer OIL1 may cover the source electrode SE, the drain electrode DE, and the first connection electrodes CM11 and CM12. The first organic insulating layer OIL1 may cover the groove GV. The first organic insulating layer OIL1 may be arranged between the inorganic insulating patterns ILP. The first organic insulating layer OIL1 may be arranged to surround the pixel area PCA along the groove GV, thereby separating the pixel circuits PC and the signal lines connected to the pixel circuit PC in units of the pixel area PCA. Accordingly, a stress or crack caused by the folding of the display panel 10 may be prevented from propagating to other pixel areas.

Second connection electrodes CM21, CM22, and CM23 may be disposed over the first organic insulating layer OIL1. The second connection electrode CM21 may be connected to the source electrode SE or the drain electrode DE through a contact hole defined in the first organic insulating layer OIL1. The second connection electrode CM22 may be connected to the first connection electrode CM11 through a contact hole defined in the first organic insulating layer OIL1. The second connection electrode CM22 may connect the upper electrodes CE2 of the capacitor Cst of adjacent pixels by being connected to the first connection electrode CM11 of the pixel circuit PC adjacent in the row direction while intersecting the groove GV. In an embodiment, the upper electrode CE2 of the capacitor Cst of each pixel circuit PC may be connected to the driving voltage line PL. The second connection electrode CM23 may be connected to the first connection electrode CM12 through a contact hole defined in the first organic insulating layer OIL1. The second connection electrode CM23 may connect the lower signal lines W1 separated in units of the pixel areas PCA of the same row by being connected to the first connection electrode CM12 of the pixel circuit PC adjacent in the row direction while intersecting the groove GV. The second connection electrodes CM21, CM22, and CM23 may include a conductive material including molybdenum (Mo), aluminum (Al), copper (Cu), titanium (Ti), or the like and may be defined by a single layer or multiple layers including at least one selected from the above materials.

A second organic insulating layer OIL2 may cover the second connection electrodes CM21, CM22, and CM23. A third connection electrode CM31 and at least one upper signal line W2 may be disposed over the second organic insulating layer OIL2. The third connection electrode CM31 may be connected to the second connection electrode CM21 through a contact hole defined in the second organic insulating layer OIL2. The at least one upper signal line W2 may be the data line DL, the driving voltage line PL, or the like. The at least one upper signal line W2 may not be separated for each pixel area PCA. The at least one upper signal line W2 may be connected to the pixel circuit PC adjacent in the column direction while intersecting the groove GV. The third connection electrode CM31 and the at least one upper signal line W2 may include a conductive material including molybdenum (Mo), aluminum (Al), copper (Cu), titanium (Ti), or the like and may be defined by a single layer a single layer or including at least one selected from the above materials.

A third organic insulating layer OIL3 may cover the third connection electrode CM31 and the at least one upper signal line W2. The first organic insulating layer OIL1, the second organic insulating layer OIL2, and the third organic insulating layer OIL3 may include an organic insulating material such as a general-purpose polymer such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any blend thereof.

The pixel area PCA illustrated in FIG. 11 may be the first pixel area PCA1 or the second pixel area PCA2, and the pixel circuit PC may be the first pixel circuit PC1, the second pixel circuit PC2, or the third pixel circuit PC3.

In an embodiment, as illustrated in FIG. 13, the first pixel circuit PC1 connected to the first display element DE1 and the second pixel circuit PC2 connected to the second display element DE2 may be arranged in the rib corresponding area DA11 of the first display area DA1. The first pixel circuit PC1 and the second pixel circuit PC2 adjacent to each other may be separated by the groove GV. In the slit corresponding area DA12 of the first display area DA1, a pixel circuit may not be arranged but a groove GV may be formed and thus at least one inorganic insulating pattern ILP may be arranged in the inorganic insulating layer IIL like in the rib corresponding area DA11. In an alternative embodiment, at least one transparent conductive layer may be arranged in the slit corresponding area DA12.

Display elements may be disposed over the third organic insulating layer OIL3. Each of the first display element DE1, the second display element DE2, and the third display element DE3 may include a pixel electrode 511, an emission layer 513, and an opposite electrode 515.

The pixel electrode 511 of the first display element DE1 may be connected to the third connection electrode CM31 through a hole VIA1 defined in the third organic insulating layer OIL3, and the third connection electrode CM31 may be connected to the second connection electrode CM21 through a contact hole CH1 to be connected to the first pixel circuit PC1. The first display element DE1 may overlap the first pixel circuit PC1 or the second pixel circuit PC2. FIG. 13 illustrates an embodiment in which the first display element DE1 overlaps the second pixel circuit PC2. Although not illustrated, the pixel electrode 511 of the third display element DE3 may be connected to the third connection electrode CM31 through a hole defined in the third organic insulating layer OIL3, and the third connection electrode CM31 may be connected to the second connection electrode CM21 through a contact hole to be connected to the third pixel circuit PC3. The third display element DE3 may overlap the third pixel circuit PC3.

The pixel electrode 511 of the second display element DE2 may be connected to the connection line CWL to be connected to the second pixel circuit PC2. In an embodiment, the connection line CWL may be arranged on the same layer as the source electrode SE or the drain electrode DE of the thin film transistor TFT. In an alternative embodiment, the connection line CWL may be disposed in a layer between the second display element DE2 and the source electrode SE or the drain electrode DE of the thin film transistor TFT. In an embodiment, for example, as illustrated in FIG. 13, the connection line CWL may be arranged between the second organic insulating layer OIL2 and the third organic insulating layer OIL3. The connection line CWL may overlap the rib corresponding area DA11 and the slit corresponding area DA12 while intersecting the groove GV. One end of the connection line CWL may be connected to the pixel electrode 511 of the second display element DE2 through a hole VIA2 defined in the third organic insulating layer OIL3. The other end of the connection line CWL may be connected to the second connection electrode CM21 through a contact hole CH2 to be connected to the second pixel circuit PC2.

In an embodiment, as illustrated in FIG. 14, the pixel electrode 511 may include a first area 511*a* in which the emission layer 513 is arranged and a second area 511*b* surrounding the first area 511*a*. The first area 511*a* may correspond to the emission area. The second area 511*b* may be connected to the lower conductive layer through a hole defined in the third organic insulating layer OIL3. In an embodiment, for example, the second area 511*b* of the pixel electrode 511 of the first display element DE1 may be connected to the third connection electrode CM31 thereunder through a hole VIA1 defined in the third organic insulating layer OIL3, and the third connection electrode CM31 may be connected to the second connection electrode CM21 thereunder through a contact hole CH1 defined in the second organic insulating layer OIL2. The hole VIA1 and the contact hole CH1 may be located in the rib corresponding area DA11 and may overlap the first pixel circuit PC1.

The second area 511*b* of the pixel electrode 511 of the second display element DE2 may be connected to one end of the connection line CWL thereunder through a hole VIA2 defined in the third organic insulating layer OIL3, and the other end of the connection line CWL may be connected to the second connection electrode CM21 thereunder through a contact hole CH2 defined in the second organic insulating layer OIL2. The hole VIA2 may be located in the slit corresponding area DA12, and the contact hole CH2 may be located in the rib corresponding area DA11 and may overlap the second pixel circuit PC2 arranged in the rib corresponding area DA11.

Because the connection line CWL that connects the second display element DE2 to the second pixel circuit PC2 is disposed in a different layer from the pixel electrode 511, the connection line CWL may be arranged to partially overlap the pixel electrode 511 of the first display element DE1 arranged in the rib corresponding area DA11.

The connection line CWL may be an opaque conductive line or a transparent conductive line. The opaque conductive line may include a metal such as molybdenum (Mo), aluminum (Al), copper (Cu), or titanium (Ti) and may be defined by a single layer or multiple layers. The transparent conductive line may include a transparent conductive oxide (TCO). In an embodiment, for example, the transparent conductive line may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The connection line CWL may be formed through a same process as the third connection electrode CM31 or may be formed through a separate process.

A pixel definition layer 119 may be disposed on the third organic insulating layer OIL3. The pixel definition layer 119 may cover the edge of the pixel electrode 511 and may define a pixel by including an opening through which a portion of the pixel electrode 511 is exposed. That is, the size and shape of the emission area may be defined by the opening of the pixel definition layer 119. The opening of the pixel definition layer 119 may correspond to the first area 511*a* of the pixel electrode 511. The pixel definition layer 119 may include or be formed of an organic insulating material such as polyimide, polyamide, acrylic resin, benzocyclobutene, hexamethyldisiloxane (HMDSO), or phenol resin by spin coating or the like. In some embodiments, the pixel definition layer 119 may include an insulating material (e.g., an organic insulating material) including a black pigment or dye to prevent color mixing between adjacent pixels to improve visibility.

The emission layer 513 may include a high molecular weight material or a low molecular weight material and may emit red, green, blue, or white light. A first common layer (not illustrated) and/or a second common layer (not illustrated) may be respectively disposed under and over the emission layer 513. The first common layer may be a component disposed under the emission layer 513 and may include, for example, a hole transport layer (HTL) or may include an HTL and a hole injection layer (HIL). The second common layer may be a component disposed over the emission layer 513 and may include an electron transport layer (ETL) and/or an electron injection layer (EIL). In some embodiments, the second common layer may be omitted.

In an embodiment, the emission layer 513 is arranged for each pixel to correspond to the opening of the pixel definition layer 119. In such an embodiment, each of the first common layer and the second common layer may be a common layer integrally formed to entirely cover the display area DA of the substrate 100 like an opposite electrode 515 described below.

An opposite electrode 515 may be disposed over the emission layer 513. The opposite electrode 515 may include a conductive material having a low work function. In an embodiment, for example, the opposite electrode 515 may include a (semi)transparent layer including silver (Ag), magnesium (Mg), aluminum (Al), platinum (Pt), lithium (Li), calcium (Ca), or any alloy thereof. Alternatively, the opposite electrode 515 may further include a layer such as ITO, IZO, ZnO, or $In_2O_3$ on the (semi)transparent layer including the above material. The opposite electrode 515 may be integrally formed in a plurality of display elements to correspond to a plurality of pixel electrodes 511.

Figure 15:
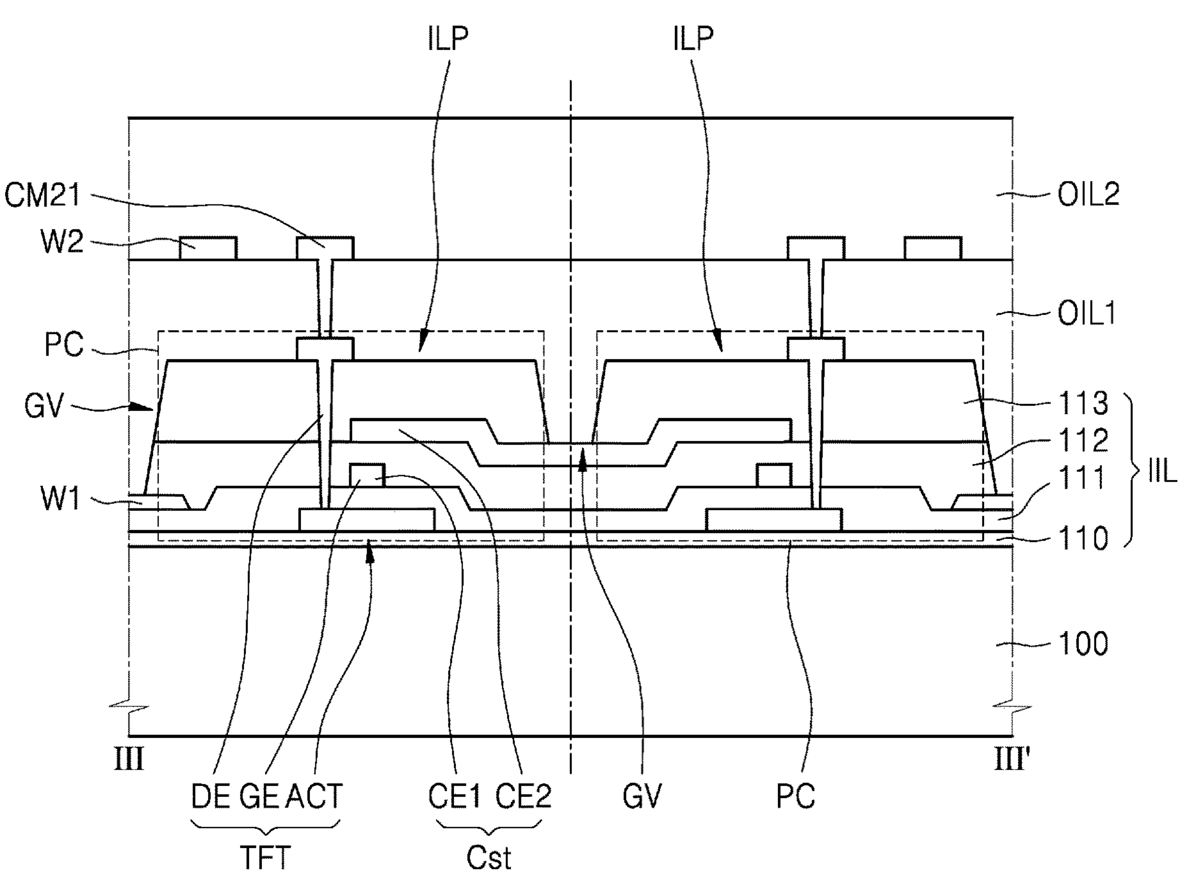
FIG. 15 is a cross-sectional view schematically illustrating a portion of the display panel of FIG. 11 taken along line III-III' in FIG. 11, according to an alternative embodiment.
Figure 16:
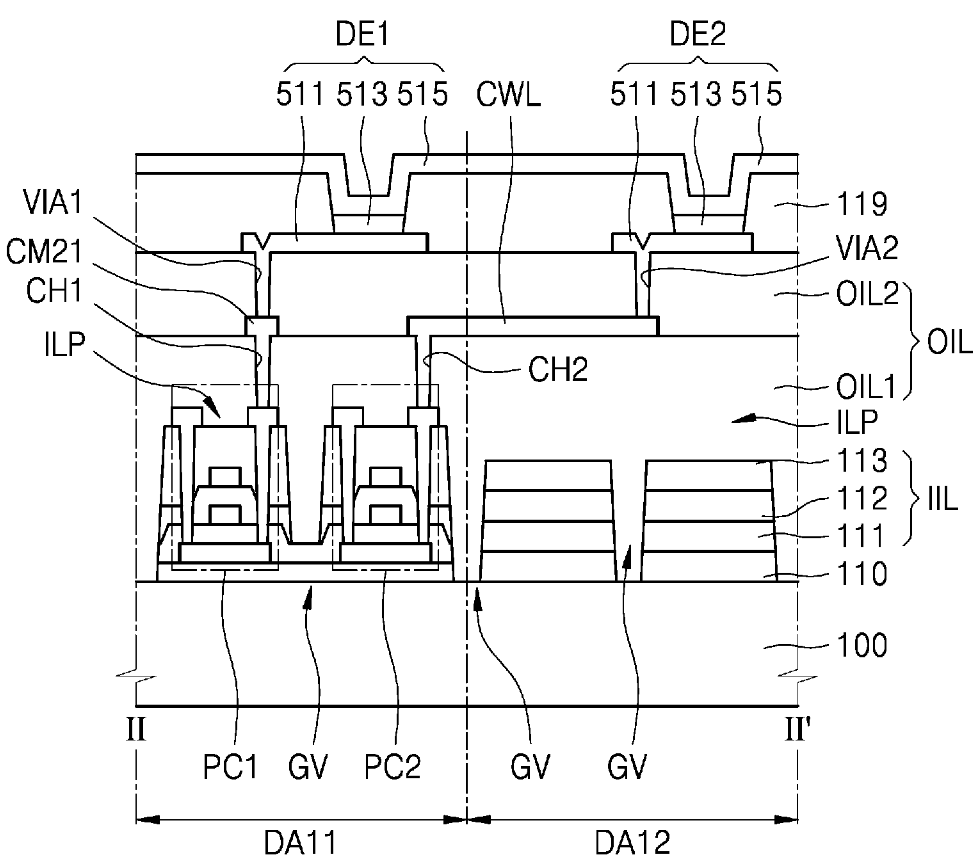
FIG. 16 is a cross-sectional view schematically illustrating a first pixel and a second pixel of a display panel according to an alternative embodiment.

FIG. 15 is a cross-sectional view schematically illustrating a portion of the display panel of FIG. 11 taken along line III-III' in FIG. 11, according to an alternative embodiment. FIG. 16 is a cross-sectional view schematically illustrating a first pixel and a second pixel of a display panel according to an alternative embodiment.

The embodiment illustrated in FIGS. 15 and 16 may be substantially the same as the embodiment illustrated in FIGS. 12 and 13 except that some devices of the pixel circuit PC and the lower signal line W1 are not separated in units of the pixel area PCA. In an embodiment, for example, the upper electrodes CE2 of the capacitor Cst of the pixel circuits PC in the row direction may be integrally formed, and the lower signal line W1 such as a scan line may extend across a plurality of pixel areas PCA in the row direction.

FIGS. 15 and 16 illustrate an embodiment where the semiconductor layer ACT is separated in units of the pixel area PCA. In another alternative embodiment, the semiconductor layers ACT of adjacent pixel circuits PC may be connected to each other. In an embodiment, for example, the semiconductor layer ACT of the left pixel area PCA illustrated in FIG. 15 may extend to the right pixel area PCA to form the semiconductor layer ACT of the right pixel area PCA.

Hereinafter, differences from the embodiment illustrated in FIGS. 12 and 13 will be mainly described, and any repetitive detailed descriptions of the same configuration will be omitted for conciseness. In FIGS. 15 and 16, the source electrode of the transistor TFT is omitted for convenience of illustration. In an embodiment, the source area of the semiconductor layer ACT may function as a portion of the source electrode, and the drain area thereof may function as a portion of the drain electrode.

A groove GV may be provided between adjacent pixel areas PCA, and the groove GV may be formed by removing some of the buffer layer 110, the first insulating layer 111, the second insulating layer 112, and the third insulating layer 113. The groove GV may overlap conductive lines intersecting the pixel areas PCA, for example, a boundary portion to which the upper electrodes CE2 of the capacitor Cst are connected and a portion of the lower signal line W1. A portion of the conductive lines intersecting the pixel areas PCA may be exposed by the groove GV and may be directly covered by the first organic insulating layer OIL1 covering the groove GV. The depth of the groove GV may be different along the boundary of the pixel area PCA. In an embodiment, for example, in an area where conductive lines intersecting the pixel areas PCA are arranged, the groove GV may be an area in which openings of the second insulating layer 112 and the third insulating layer 113 overlap each other. In an area where there are no conductive lines intersecting the pixel areas PCA, the groove GV may be an area in which openings of the buffer layer 110, the first insulating layer 111, the second insulating layer 112, and the third insulating layer 113 overlap each other. In an embodiment, the inorganic insulating pattern ILP may be a pattern of the third insulating layer 113 arranged in an island type for each pixel area PCA. The groove GV may be covered or filled by the first organic insulating layer OIL1.

As illustrated in FIG. 16, display elements may be disposed over the second organic insulating layer OIL2. The pixel electrode 511 of the first display element DE1 arranged in the rib corresponding area DA11 may be connected to the second connection electrode CM21 through a hole VIA1 defined in the second organic insulating layer OIL2, and the second connection electrode CM21 may be connected to the source electrode SE or the drain electrode DE through a contact hole CH1 defined in the first organic insulating layer OIL1 to be connected to the first pixel circuit PC1. The pixel electrode 511 of the second display element DE2 arranged in the slit corresponding area DA12 may be connected to one end of the connection line CWL through a hole VIA2 defined in the second organic insulating layer OIL2, and the other end of the connection line CWL may be connected to the source electrode SE or the drain electrode DE through a contact hole CH2 defined in the first organic insulating layer OIL1 to be connected to the second pixel circuit PC2. The hole VIA2 may be located in the slit corresponding area DA12, and the contact hole CH2 may be located in the rib corresponding area DA11 and may overlap the second pixel circuit PC2 arranged in the rib corresponding area DA11.

In an embodiment, the connection line CWL may be arranged in a same layer as the source electrode SE or the drain electrode DE of the thin film transistor TFT. In an alternative embodiment, the connection line CWL may be disposed in a layer between the second display element DE2 and the source electrode SE or the drain electrode DE of the thin film transistor TFT. In an embodiment, for example, as illustrated in FIG. 16, the connection line CWL may be arranged between the first organic insulating layer OIL1 and the second organic insulating layer OIL2.

According to the embodiment illustrated in FIGS. 15 and 16, because the connection electrodes (e.g., the connection electrodes CM11, CM12, CM22, and CM23 of FIG. 12) for connecting the conductive layers separated in units of the pixel area PCA may be omitted in the display panel 10, the mask process and the configuration of the pixel circuit layer may be simplified. Because the connection electrodes CM11, CM12, CM22, and CM23 are omitted, upper signal lines W2 such as data lines and driving voltage lines may be disposed on the third insulating layer 113 and the first organic insulating layer OIL1 and the third organic insulating layer OIL3 may also be omitted.

Figure 17:
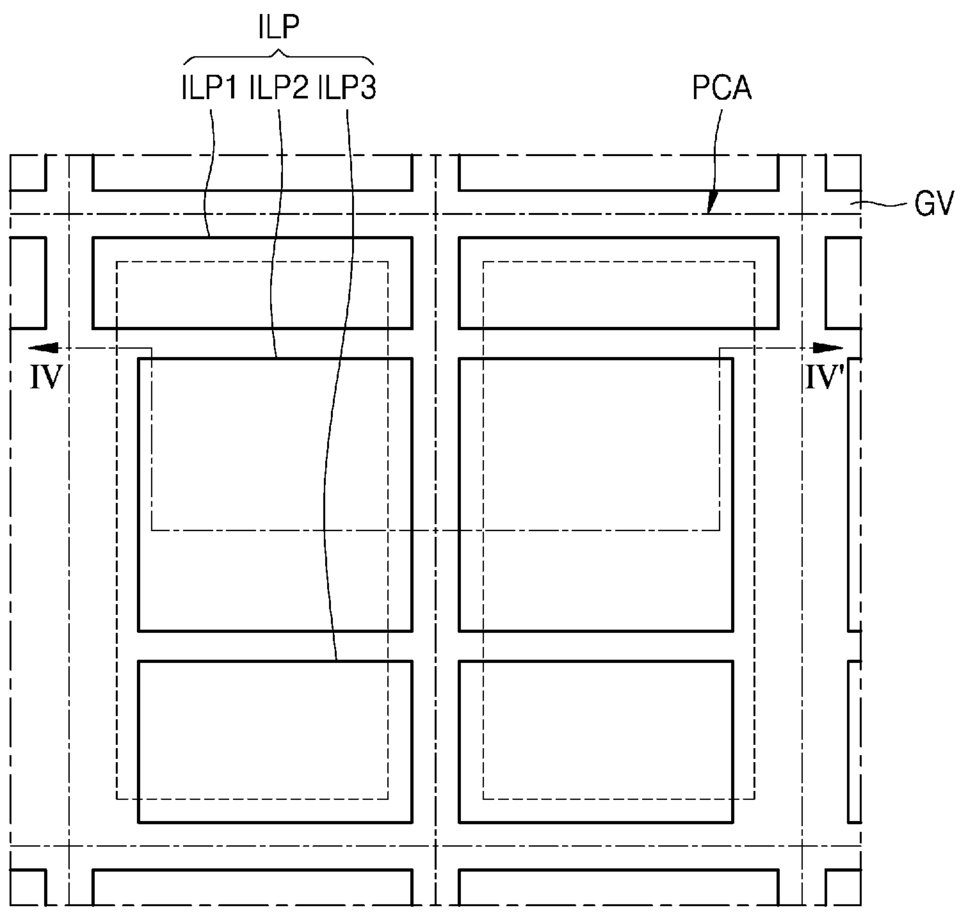
FIG. 17 is a diagram schematically illustrating pixel areas of a display panel according to an embodiment.
Figure 17:
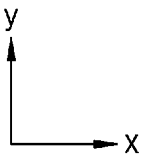
Figure 18:
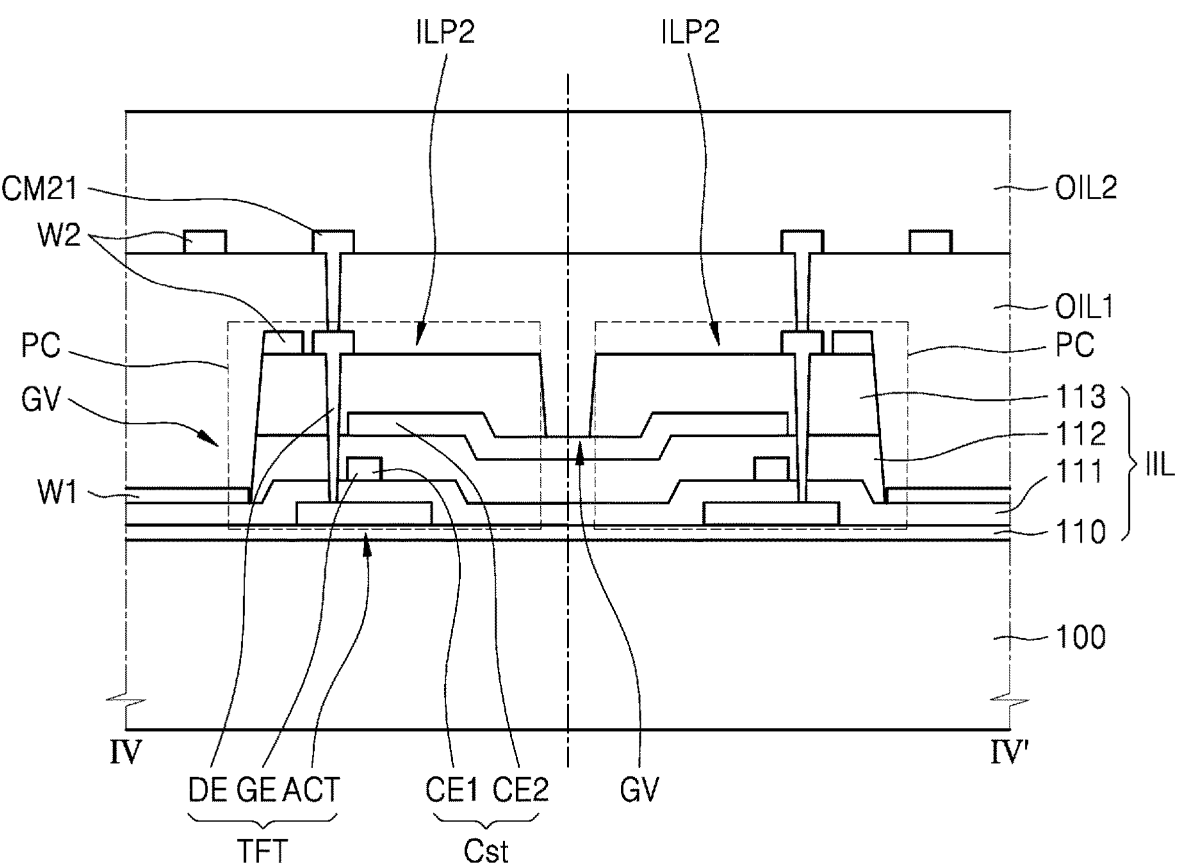
FIG. 18 is a cross-sectional view schematically illustrating a portion of the display panel of FIG. 17 taken along line IV-IV' in FIG. 17, according to an embodiment.
Figure 19:
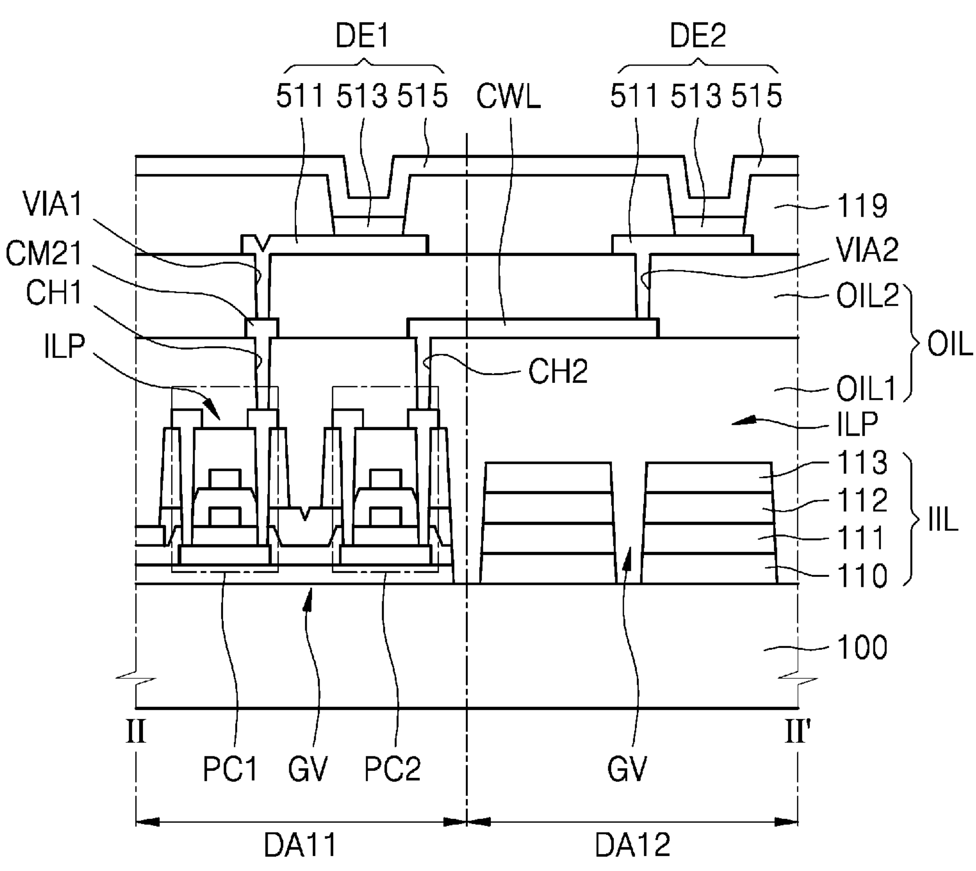
FIG. 19 is a cross-sectional view schematically illustrating a first pixel and a second pixel of a display panel according to an embodiment.

FIG. 17 is a diagram schematically illustrating pixel areas of a display panel according to an embodiment. FIG. 17 may be a diagram schematically illustrating a portion of the pixel areas of FIG. 10. FIG. 18 is a cross-sectional view schematically illustrating a portion of the display panel of FIG. 17 taken along line IV-IV' in FIG. 17, according to an embodiment. FIG. 19 is a cross-sectional view schematically illustrating a first pixel and a second pixel of a display panel according to an embodiment. FIG. 19 may be a cross-sectional view schematically illustrating a portion of the display panel of FIG. 10 taken along line II-II' in FIG. 10.

The embodiment illustrated in FIGS. 17 to 19 may be substantially the same as the embodiment illustrated in FIGS. 15 and 16 except that a plurality of inorganic insulating patterns ILP are arranged in the pixel area PCA and the width of the groove GV is irregular. Hereinafter, differences from the embodiment illustrated in FIGS. 12 to 16 will be mainly described, and any repetitive detailed descriptions of the same configuration will be omitted for conciseness.

Referring to FIG. 17, a plurality of inorganic insulating patterns ILP1, ILP2, and ILP3 may be arranged in the pixel area PCA. As illustrated in FIGS. 18 and 19, a groove GV surrounding the pixel area PCA may be defined or formed in the buffer layer 110, the first insulating layer 111, the second insulating layer 112, and the third insulating layer 113.

The groove GV may also be formed in the pixel area PCA. Some of the conductive lines arranged in the pixel areas PCA may be exposed by the groove GV and may be directly covered by the first organic insulating layer OIL1 filling the groove GV. For example, at least one lower signal line W1 extending in the x direction between the inorganic insulating patterns ILP1, ILP2, and ILP3 in the y direction may be exposed by the groove GV and may be directly covered by the first organic insulating layer OIL1.

In the process of patterning the conductive layer over the third insulating layer 113, a portion of the buffer layer 110, the first insulating layer 111, the second insulating layer 112, and the third insulating layer 113 may be additionally removed. Accordingly, the width may be expanded in a portion of the groove GV. In an embodiment, the inorganic insulating patterns ILP1, ILP2, and ILP3 may be patterns of the third insulating layer 113 arranged in an island type with different sizes for each pixel area PCA.

As illustrated in FIG. 19, the connection line CWL may be arranged between the first organic insulating layer OIL1 and the second organic insulating layer OIL2. The hole VIA2 may be located in the slit corresponding area DA12, and the contact hole CH2 may be located in the rib corresponding area DA11 and may overlap the second pixel circuit PC2 arranged in the rib corresponding area DA11.

Figure 20:
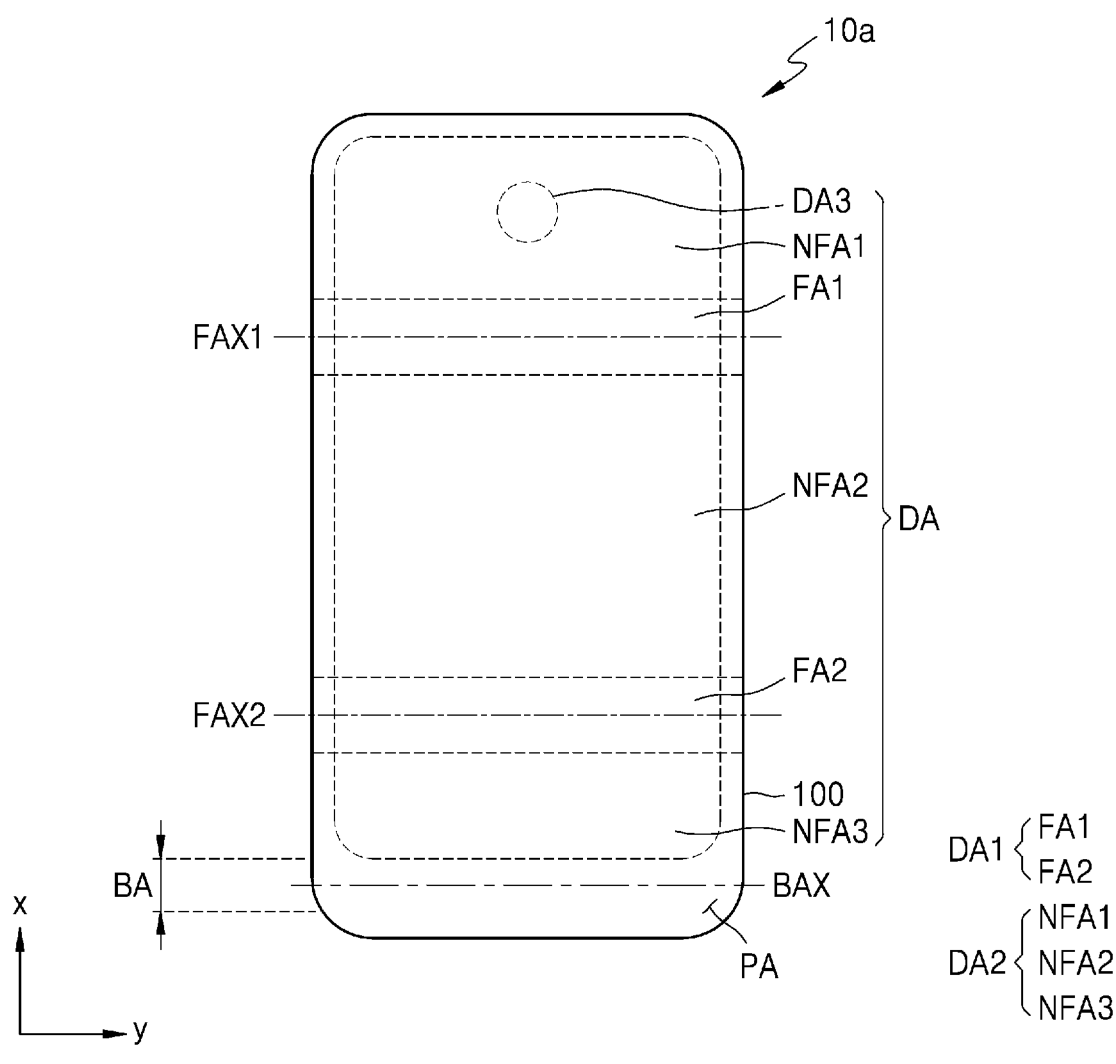
FIG. 20 is a diagram schematically illustrating a display panel according to an embodiment.
Figure 21:
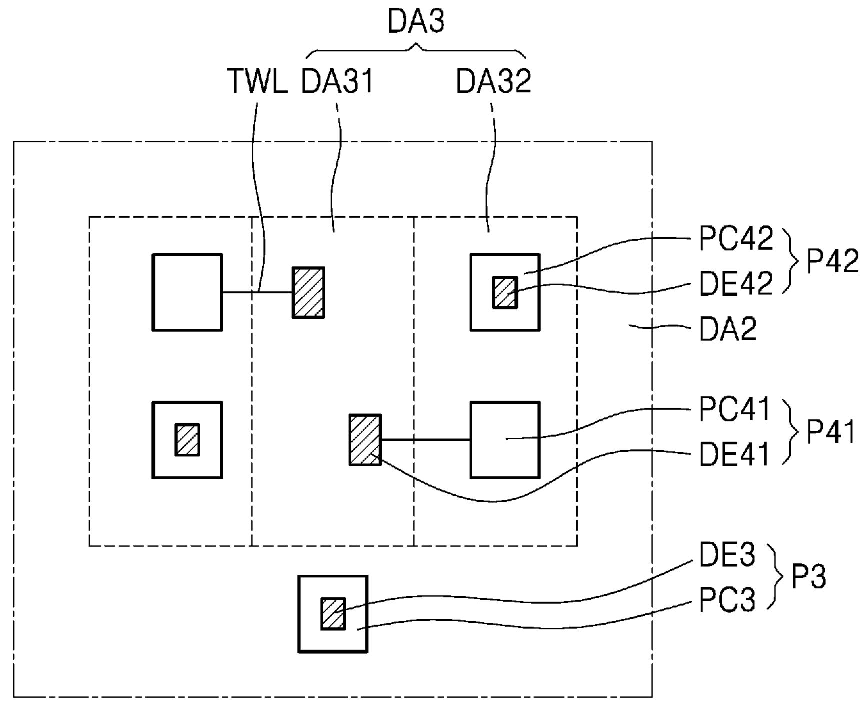
FIG. 21 is a diagram schematically illustrating a third display area of FIG. 20 and a periphery thereof.
Figure 22:
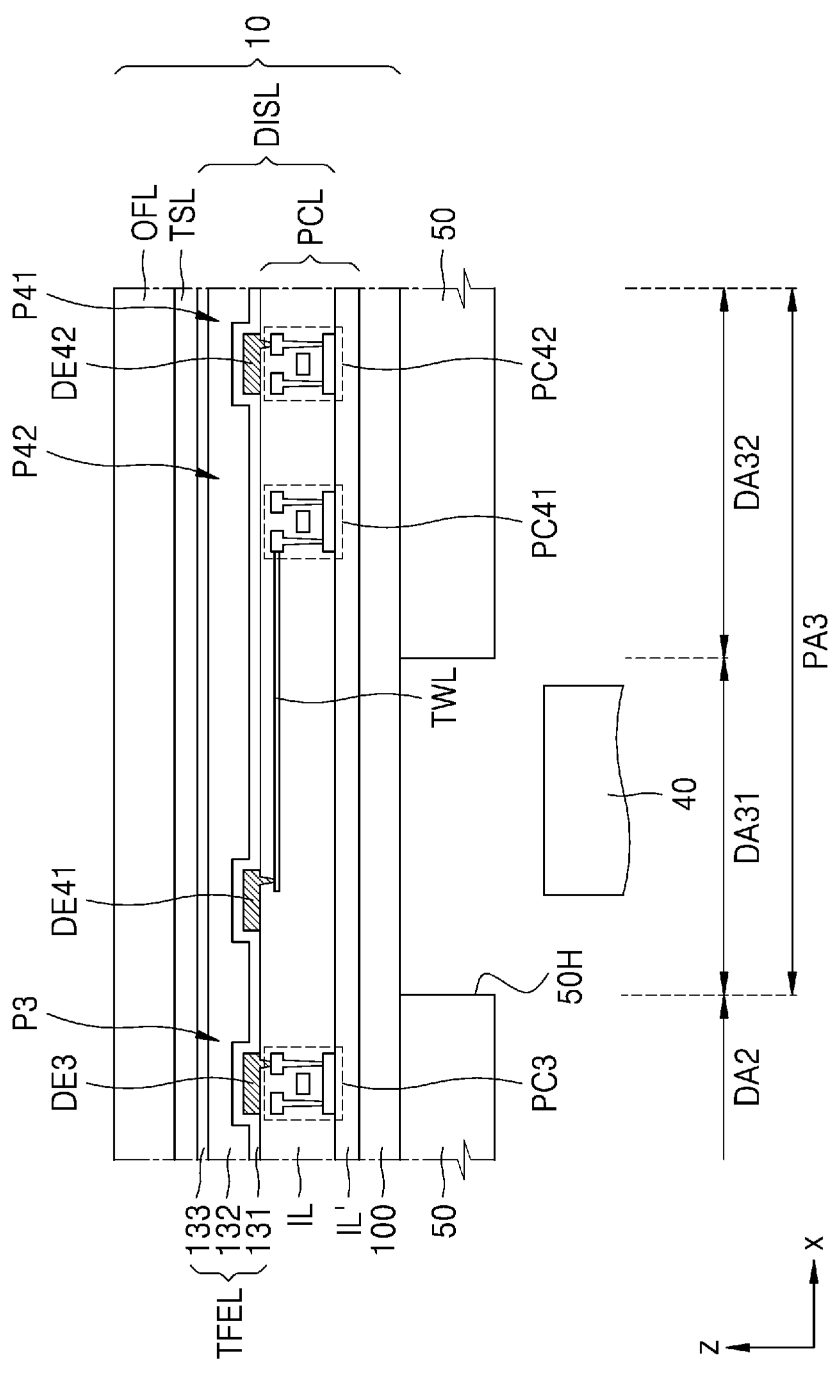
FIG. 22 is a cross-sectional view schematically illustrating a portion of the display apparatus of FIG. 20 according to an embodiment.

FIG. 20 is a diagram schematically illustrating a display panel according to an embodiment. FIG. 21 is a diagram schematically illustrating a third display area of FIG. 20 and a periphery thereof. FIG. 22 is a cross-sectional view schematically illustrating a portion of the display apparatus of FIG. 20 according to an embodiment.

FIG. 20 illustrates an embodiment of a display panel 10*a* in which a third display area DA3 is further included in the display panel 10 illustrated in FIG. 3. Hereinafter, differences from the above embodiments will be mainly described, and any repetitive detailed descriptions thereof will be omitted for conciseness.

Referring to FIG. 20, the display panel 10*a* may include a display area DA and a peripheral area PA. The display area DA may include a first display area DA1, a second display area DA2, and a third display area DA3. The first display area DA1 may include a first folding area FA1 and a second folding area FA2. The second display area DA2 may include a first non-folding area NFA1, a second non-folding area NFA2, and a third non-folding area NFA3. The second display area DA2 may surround the third display area DA3. The first display area DA1 and the second display area DA2 may be an area in which a main image is displayed, and the third display area DA3 may be an area in which an auxiliary image is displayed. The auxiliary image may form (or be a part of) an entire image together with the main image, and the auxiliary image may be an image independent from the main image.

The third display area DA3 may be an area overlapping the component. The light transmittance of the display apparatus in the third display area DA3 may be about 10% or more, for example, about 25% or more, about 40% or more, about 50% or more, about 85% or more, or about 90% or more. In an embodiment, the light or sound transmittance of the display apparatus in the third display area DA3 may be higher than or equal to the light or sound transmittance of the display apparatus in the first display area DA1 and the second display area DA2.

The display panel 10*a* may include at least one third display area DA3. In an embodiment, for example, the display panel 10*a* may include one third display area DA3 or may include a plurality of third display areas DA3. Although an embodiment where the third display area DA3 is arranged in the first non-folding area NFA1 is illustrated in FIG. 20, this is merely an example. In an alternative embodiment, the third display area DA3 may be arranged in the second non-folding area NFA2 or the third non-folding area NFA3. In an embodiment where the display panel 10*a* includes a plurality of third display areas DA3, the positions, shapes, and sizes of the third display areas DA3 may be different from each other.

Referring to FIG. 21, the third display area DA3 may include a component area DA31 and an intermediate area DA32 at least partially surrounding the component area DA31. Thus, the intermediate area DA32 may be located between the component area DA31 and the second display area DA2. A first auxiliary pixel P41 and a second auxiliary pixel P42 may be arranged in the third display area DA3. The first auxiliary pixel P41 may include a first auxiliary pixel circuit PC41 and a first auxiliary display element DE41 connected thereto. The second auxiliary pixel P42 may include a second auxiliary pixel circuit PC42 and a second auxiliary display element DE42 connected thereto. The first auxiliary display element DE41 may be arranged in the component area DA31, and the first auxiliary pixel circuit PC41 may be arranged in the intermediate area DA32. The first auxiliary display element DE41 may be connected to the first auxiliary pixel circuit PC41 by a connection line TWL. The second auxiliary pixel circuit PC42 and the second auxiliary display element DE42 may be arranged in the intermediate area DA32.

Hereinafter, embodiments of the invention will be described with reference to FIGS. 7, 21, 22, and 23 together.

A first pixel P1 including a first pixel circuit PC1 and a first display element DE1 connected thereto and a second pixel P2 including a second pixel circuit PC2 and a second display element DE2 connected thereto may be arranged in the first display area DA1. The first pixel circuit PC1, the second pixel circuit PC2, and the first display element DE1 may be arranged in the rib corresponding area DA11 of the first display area DA1, and the second display element DE2 may be arranged in the slit corresponding area DA12 of the first display area DA1. The second pixel circuit PC2 arranged in the rib corresponding area DA11 may be connected by a connection line CWL to the second display element DE2 arranged in the slit corresponding area DA12.

A third pixel P3 including a third pixel circuit PC3 and a third display element DE3 connected thereto may be arranged in the second display area DA2.

Hereinafter, for convenience of description, a line that connects the second display element DE2 to the second pixel circuit PC2 in the first display area DA1 will be referred to as a first connection line CWL, and a line that connects the first auxiliary display element DE41 to the first auxiliary pixel circuit PC41 in the third display area DA3 will be referred to as a second connection line TWL.

A first auxiliary pixel P41 including a first auxiliary pixel circuit PC41 and a first auxiliary display element DE41 connected thereto and a second auxiliary pixel P42 including a second auxiliary pixel circuit PC42 and a second auxiliary display element DE42 connected thereto may be arranged in the third display area DA3. The first auxiliary pixel circuit PC41, the second auxiliary pixel circuit PC42, and the second auxiliary display element DE42 may be arranged in the intermediate area DA32, and the first auxiliary display element DE41 may be arranged in the component area DA31. Each of the first auxiliary pixel circuit PC41 and the second auxiliary pixel circuit PC42 may include at least one thin film transistor. The first auxiliary pixel circuit PC41 may be connected to the first auxiliary display element DE41 by the second connection line TWL.

A component 40 may include an imaging device as a camera using infrared light or visible light. Alternatively, the component 40 may be at least one sensor including a solar cell, a flash, an illuminance sensor, a proximity sensor, an iris sensor, or the like. Alternatively, the component 40 may be a sound receiver having a function of receiving sound. In an embodiment, the first auxiliary pixel circuit PC41 for driving the first auxiliary display element DE41 arranged in the component area DA31 may not be arranged in the component area DA31 but may be arranged in the intermediate area DA32 to minimize the limitation of the function of the component 40. Thus, the transmittance of the display panel 10*a* in the component area DA31 may be higher than the transmittance of the display panel 10*a* in the first display area DA1 and the second display area DA2. A plurality of components 40 may be arranged in the third display area DA3. The plurality of components 40 may have different functions from each other.

The third display area DA3 may include a transmission area through which the light/signal emitted from the component 40 or the light/signal incident onto the component 40 is transmitted. In the third display area DA3, the transmission area may be the other area of the component area DA31 in which the pixel electrode (anode) of the first auxiliary display element DE41 is not arranged. The transmission area may be an area other than the area of the component area DA31 in which the first auxiliary display element DE41 emits light. The transmission area may include an area between the first auxiliary display elements DE41 in the component area DA31. Only some layers of the insulating layers IL and IL' may be arranged in the transmission area. An opposite electrode (cathode) may be arranged in the transmission area. An inorganic encapsulation layer and/or an organic encapsulation layer of the thin film encapsulation layer TFEL may be arranged in the transmission area. A conductive line including or formed of a metal and/or a transparent conductive material may be arranged in the transmission area. The substrate 100, a polarization plate, an adhesive, and a window may be arranged in the transmission area.

The first display area DA1, the second display area DA2, and the third display area DA3 may be surrounded by a peripheral area PA. The peripheral area PA may include a bending area BA that is bent with respect to a bending axis BAX. Because the substrate 100 is bent in the bending area BA and thus an area to which a driving chip of the substrate 100 is connected is located behind the display area DA, the user may recognize that the display area DA occupies most of the display apparatus.

Figure 23:
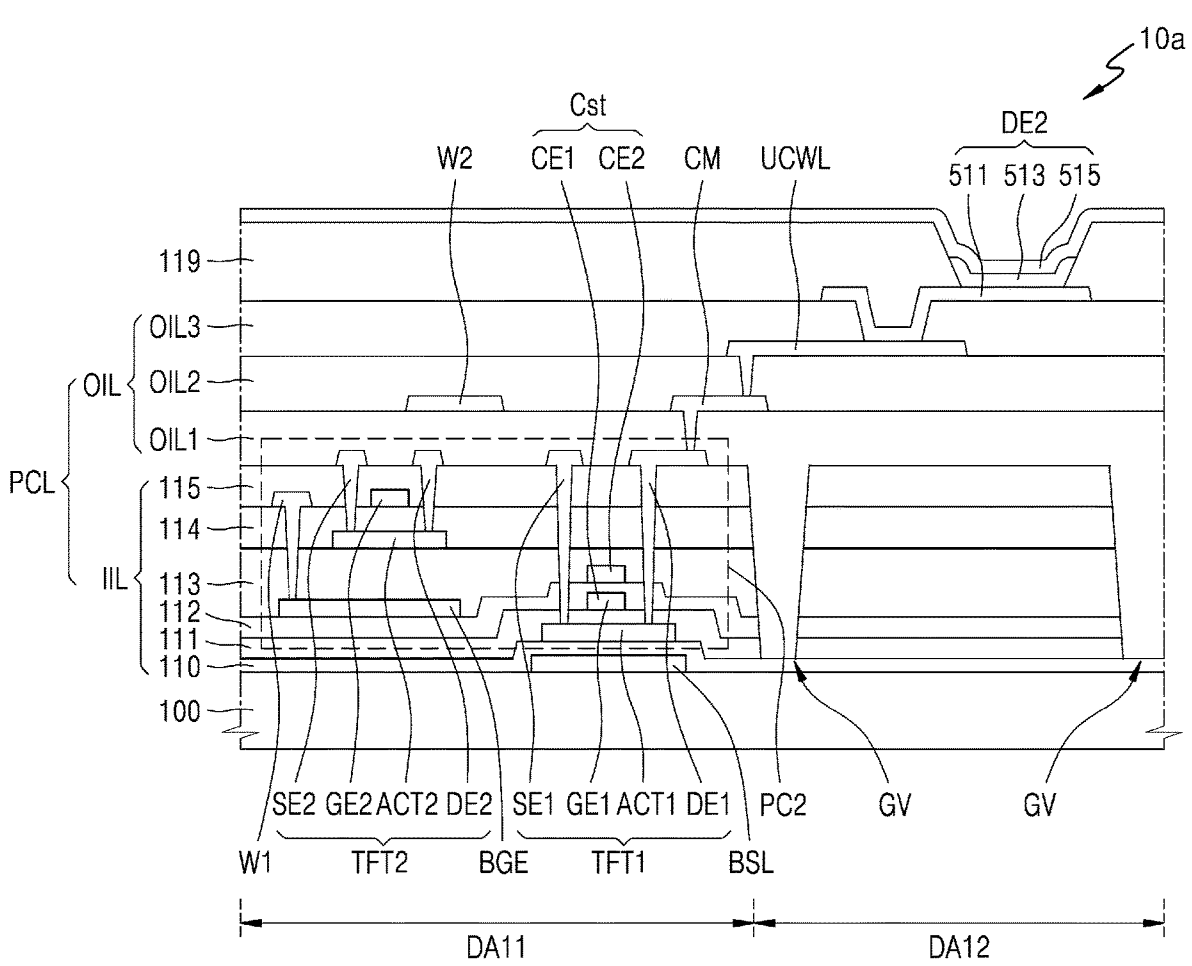
FIGS. 23 to 26 are cross-sectional views schematically illustrating a portion of a display panel according to an embodiment.
Figure 24:
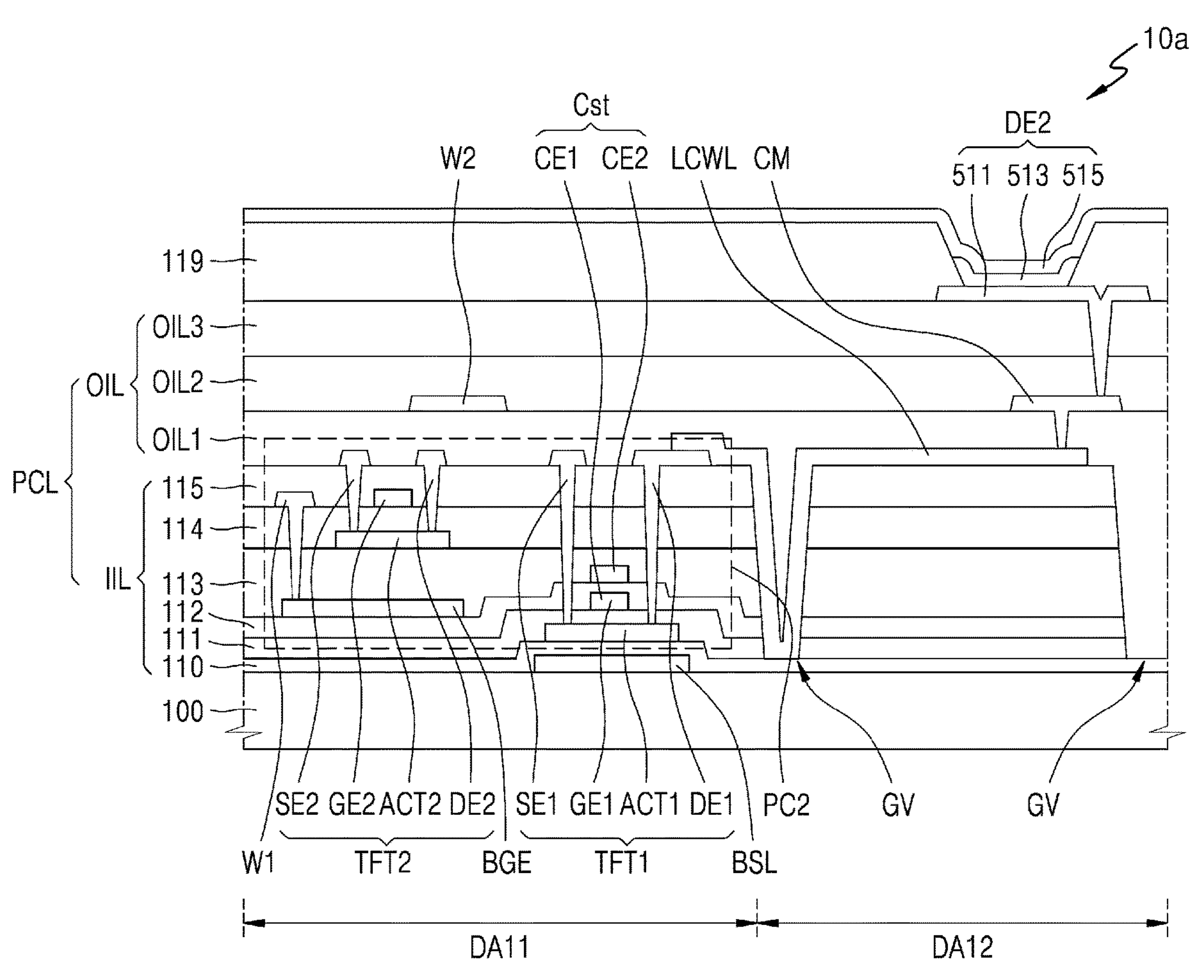
Figure 25:
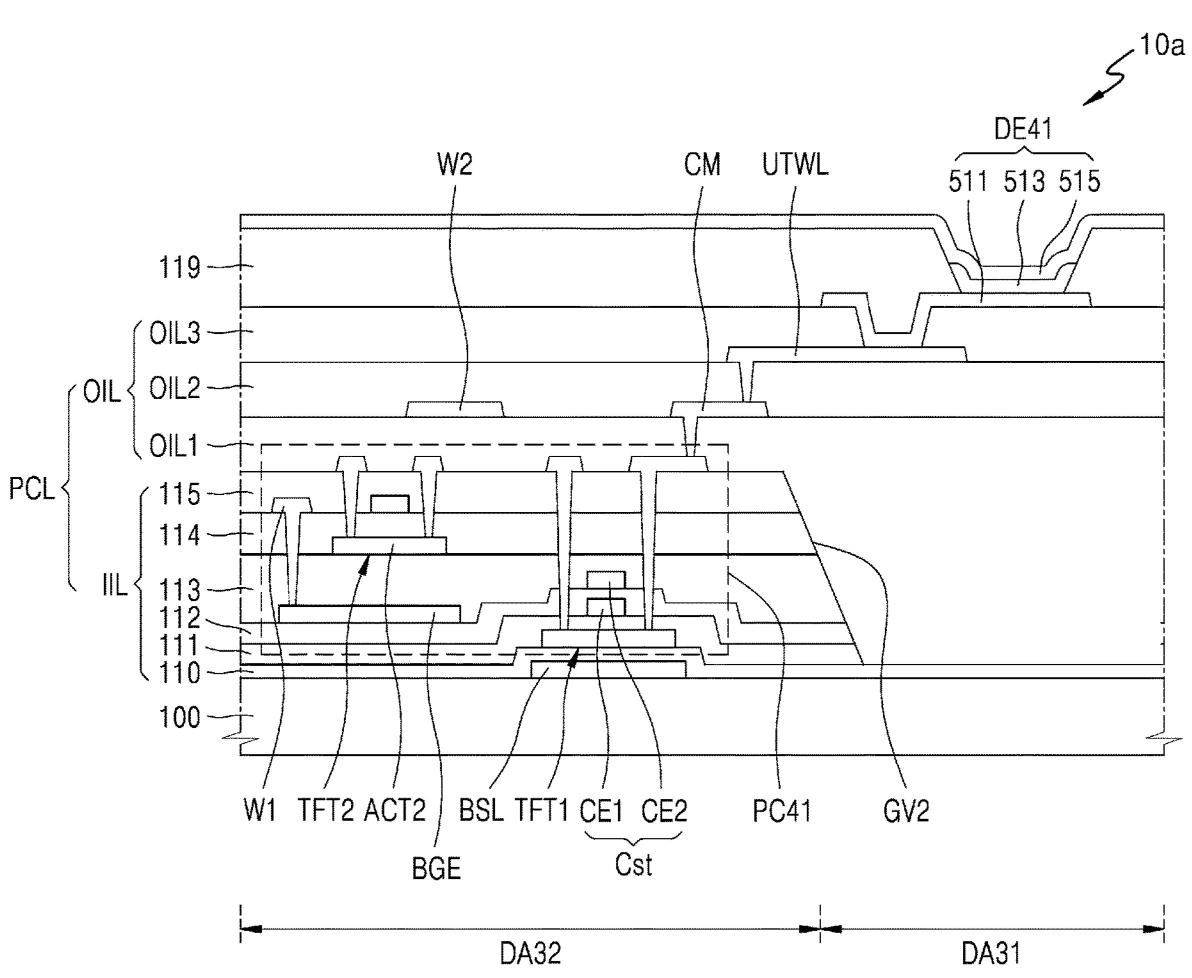
Figure 26:
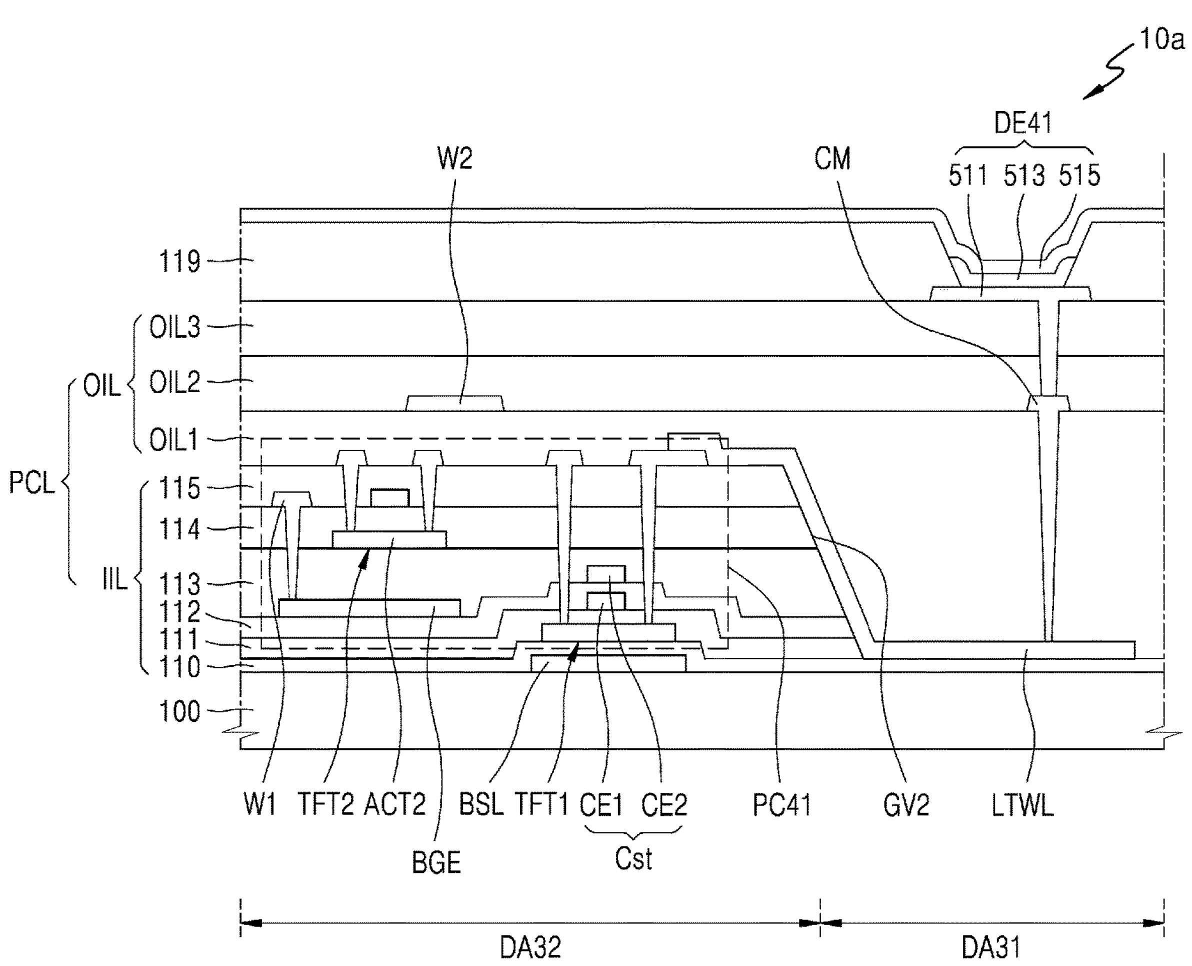

FIGS. 23 to 26 are cross-sectional views schematically illustrating a portion of a display panel according to an embodiment. FIGS. 23 and 24 are cross-sectional views schematically illustrating a second pixel of a display panel according to an embodiment. FIGS. 25 and 26 are cross-sectional views schematically illustrating a portion of a first auxiliary pixel of a display panel according to an embodiment.

The first pixel circuit PC1, the second pixel circuit PC2, and the first display element DE1 may be arranged in the rib corresponding area DA11 of the first display area DA1, and the second display element DE2 may be arranged in the slit corresponding area DA12 of the first display area DA1. The second pixel circuit PC2 may be connected to the second display element DE2 by the first connection line CWL. A third pixel P3 including a third pixel circuit PC3 and a third display element DE3 connected thereto may be arranged in the second display area DA2. The first auxiliary pixel circuit PC41, the second auxiliary pixel circuit PC42, and the second auxiliary display element DE42 may be arranged in the intermediate area DA32 of the third display area DA3, and the first auxiliary display element DE41 may be arranged in the component area DA31 of the third display area DA3.

In an embodiment, each of the first pixel circuit PC1, the second pixel circuit PC2, the third pixel circuit PC3, the first auxiliary pixel circuit PC41, and the second auxiliary pixel circuit PC42 may include a first thin film transistor TFT1 including a silicon semiconductor and a second thin film transistor TFT2 including an oxide semiconductor. Each of the first pixel circuit PC1, the second pixel circuit PC2, the third pixel circuit PC3, the first auxiliary pixel circuit PC41, and the second auxiliary pixel circuit PC42 may further include a capacitor Cst.

The first thin film transistor TFT1 may include a first semiconductor layer ACT1 including a silicon semiconductor, and a first gate electrode GE1 insulated from the first semiconductor layer ACT1. The first thin film transistor TFT1 may include a first source electrode SE1 and/or a first drain electrode DE1 connected to the first semiconductor layer ACT1. The first thin film transistor TFT1 may function as a driving thin film transistor.

The second thin film transistor TFT2 may include a second semiconductor layer ACT2 including an oxide semiconductor, and a second gate electrode GE2 insulated from the second semiconductor layer ACT2. The second thin film transistor TFT2 may include a second source electrode SE2 and/or a second drain electrode DE2 connected to the second semiconductor layer ACT2. The second thin film transistor TFT2 may function as a switching thin film transistor. Alternatively, the second thin film transistor TFT2 may be any thin film transistor other than the driving thin film transistor.

In such embodiments, by configuring at least one of the other thin film transistors other than the driving thin film transistor to include an active layer including an oxide semiconductor, the power consumption of the display apparatus may be reduced.

In such embodiments, a lower blocking layer BSL overlapping the first thin film transistor TFT1 may be disposed under the first thin film transistor. A constant voltage may be applied to the lower blocking layer BSL. As the lower blocking layer BSL is disposed under the first thin film transistor TFT1, the first thin film transistor TFT1 may be less affected by ambient interference signals and thus the reliability thereof may be further improved.

Hereinafter, a structure in which the components included in the display panel 10*a* are stacked will be described with reference to FIGS. 23 to 26. Differences from the above embodiments will be mainly described, and any repetitive detailed descriptions of the same configuration will be omitted for conciseness.

A buffer layer 110 may be disposed on the substrate 100, and the lower blocking layer BSL may be arranged between the substrate 100 and the buffer layer 110. The lower blocking layer BSL may include a conductive material. In some embodiments, the lower blocking layer BSL may include a transparent conductive material. In an embodiment, for example, the lower blocking layer BSL may include a conductive oxide such as ITO, IZO, zinc oxide (ZnO), indium oxide ($In_2O_3$), IGO, or AZO. A barrier layer (not illustrated) for blocking the penetration of external air may be further included between the substrate 100 and the lower blocking layer BSL. The barrier layer may include an inorganic material such as oxide or nitride, an organic material, or an organic/inorganic composite and may be defined by a single-layer or multiple-layer structure of an inorganic material and an organic material.

A first semiconductor layer ACT1 including a silicon semiconductor may be disposed on the buffer layer 110, and the first semiconductor layer ACT1 may include polysilicon or amorphous silicon. The first semiconductor layer ACT1 may include a channel area, a source area, and a drain area.

A first insulating layer 111 may be arranged to cover the first semiconductor layer ACT1. A first gate electrode GE1 may be disposed over the first insulating layer 111 to overlap the first semiconductor layer ACT1. The first gate electrode GE1 may include molybdenum (Mo), aluminum (Al), copper (Cu), titanium (Ti), or the like and may be defined by a single layer or multiple layers. In an embodiment, for example, the first gate electrode GE1 may include a single Mo layer.

The second insulating layer 112 may cover the first gate electrode GE1, and a capacitor Cst may be overlapped on the first gate electrode GE1. The capacitor Cst may include a lower electrode CE1 and an upper electrode CE2.

A lower gate electrode BGE may be disposed on the second insulating layer 112. The lower gate electrode BGE may overlap the second semiconductor layer ACT2 of the second thin film transistor TFT2 to apply a scan signal to the second thin film transistor TFT2. In an embodiment, the second thin film transistor TFT2 may have a dual-gate electrode structure in which gate electrodes are disposed over and under the second semiconductor layer ACT2.

The third insulating layer 113 may cover the upper electrode CE2 and the lower gate electrode BGE. A second semiconductor layer ACT2 including an oxide semiconductor may be disposed on the third insulating layer 113. The second semiconductor layer ACT2 may include a channel area, a source area, and a drain area. The second semiconductor layer ACT2 may include an oxide of at least one selected from indium (In), gallium (Ga), stannum (Sn), zirconium (Zr), hafnium (Hf), titanium (Ti), and zinc (Zn). In some embodiments, the second semiconductor layer ACT2 may include an In—Ga—Zn—O (IGZO) semiconductor containing a metal such as indium (In) and gallium (Ga) in ZnO.

A second gate electrode GE2 may be disposed on the second semiconductor layer ACT2, and a fourth insulating layer 114 may be arranged between the second semiconductor layer ACT2 and the second gate electrode GE2. The second gate electrode GE2 may be arranged to overlap the second semiconductor layer ACT2 and may be insulated from the second semiconductor layer ACT2 by the fourth insulating layer 114.

The fourth insulating layer 114 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), or hafnium oxide ($HfO_2$). The fourth insulating layer 114 may be defined by a single layer or multiple layers including at least one selected from the above inorganic insulating materials.

A lower signal line W1 may be disposed on the fourth insulating layer 114. In an embodiment, the lower signal line W1 may be a scan line, and the scan line may be connected to the lower gate electrode BGE through a contact hole defined in the third insulating layer 113 and the fourth insulating layer 114. The scan line may be configured to transmit a scan signal to the lower gate electrode BGE.

A fifth insulating layer 115 may be disposed on the second gate electrode GE2. A first source electrode SE1 and/or a first drain electrode DE1 connected to the first semiconductor layer ACT1 and a second source electrode SE2 and/or a second drain electrode DE2 connected to the second semiconductor layer ACT2 may be disposed on the fifth insulating layer 115.

The fifth insulating layer 115 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), or hafnium oxide ($HfO_2$). The fifth insulating layer 115 may be defined by a single layer or multiple layers including the above inorganic insulating material.

The first source electrode SE1 and/or the first drain electrode DE1 and the second source electrode SE2 and/or the second drain electrode DE2 may include a high-conductivity material such as a metal or a conductive oxide. In an embodiment, for example, the first source electrode SE1 and/or the first drain electrode DE1 and the second source electrode SE2 and/or the second drain electrode DE2 may include a single layer or multiple layers including aluminum (Al), copper (Cu), titanium (Ti), or the like. In some embodiments, the first source electrode SE1 and/or the first drain electrode DE1 and the second source electrode SE2 and/or the second drain electrode DE2 may include a three-layer structure of titanium/aluminum/titanium (Ti/Al/Ti) that are sequentially arranged.

A first organic insulating layer OIL1 may be disposed on the first source electrode SE1 and/or the first drain electrode DE1 and the second source electrode SE2 and/or the second drain electrode DE2.

A connection electrode CM may be disposed on the first organic insulating layer OIL1. The connection electrode CM may be electrically connected to the first drain electrode DE1 or the first source electrode SE1 through a contact hole defined in the first organic insulating layer OIL1. The connection electrode CM may include a conductive material including molybdenum (Mo), aluminum (Al), copper (Cu), titanium (Ti), or the like and may be defined by a single layer or multiple layers including at least one selected from the above materials. In an embodiment, the connection electrode CM may include a multilayer structure of Ti/Al/Ti.

At least one upper signal line W2 may be further disposed on the first organic insulating layer OIL1. The at least one upper signal line W2 may be a data line, a driving voltage line, or the like. The first source electrode SE1, the first drain electrode DE1, the second source electrode SE2, or the second drain electrode DE2 may be connected to the data line or the driving voltage line directly or through another thin film transistor. A second organic insulating layer OIL2 and a third organic insulating layer OIL3 may be disposed on the first organic insulating layer OIL1.

Display elements DE1, DE2, DE3, DE41, and DE42 may be disposed on the organic insulating layer OIL. The display elements DE1, DE2, DE3, DE41, and DE42 may be organic light emitting diodes OLED. The display elements DE1, DE2, DE3, DE41, and DE42 may be respectively electrically connected to the pixel circuits PC1, PC2, PC3, PC41, and PC42 corresponding thereto. Each of the display elements DE1, DE2, DE3, DE41, and DE42 may include a pixel electrode 511, an emission layer 513, and an opposite electrode 515.

The pixel electrode 511 may be disposed on the third organic insulating layer OIL3. The pixel electrode 511 may be directly connected to the first thin film transistor TFT1 through the connection electrode CM or may be indirectly connected to the first thin film transistor TFT1 via another thin film transistor (not illustrated) connected to the connection electrode CM.

In some embodiments, the inorganic insulating layer IIL of the display panel 10*a* may include a groove GV corresponding to the boundary of the pixel area PCA of the first display area DA1, the second display area DA2, and the intermediate area DA32 of the third display area DA3 and a groove GV2 or an opening corresponding to the component area DA31 of the third display area DA3. In an embodiment, for example, where the buffer layer 110, the first insulating layer 111, the second insulating layer 112, the third insulating layer 113, the fourth insulating layer 114, and the fifth insulating layer 115 are collectively referred to as an inorganic insulating layer IIL, a groove GV corresponding to the boundary of the pixel area PCA and a groove GV2 corresponding to the component area DA31 may be formed by removing a portion of the inorganic insulating layer IIL, as illustrated in FIGS. 23 to 26.

Openings of insulating layers forming the grooves GV and GV2 may be separately formed through separate processes or may be simultaneously formed through a same process. In an embodiment where the openings are separately formed through separate processes, the grooves GV and GV2 may have a stepped structure or a stair-like shape. The first organic insulating layer OIL1 may fill the grooves GV and GV2.

The pixel electrode 511 of the second display element DE2 may be connected to the connection electrode CM through the first connection line CWL to be connected to the second pixel circuit PC2. One end of the first connection line CWL may be connected to the second pixel circuit PC2, and the other end thereof may be connected to the pixel electrode 511 of the second display element DE2. The first connection line CWL may be continuously located in the rib corresponding area DA11 and the slit corresponding area DA12 while intersecting the groove GV. One end of the first connection line CWL may be connected to the second pixel circuit PC2 in the rib corresponding area DA11, and the other end thereof may be connected to the connection electrode CM through a contact hole defined in the slit corresponding area DA12 to be connected to the pixel electrode 511 of the second display element DE2.

The first connection line CWL may be a first upper connection line UCWL or a first lower connection line LCWL. As illustrated in FIG. 23, the first upper connection line UCWL may be arranged between the second organic insulating layer OIL2 and the third organic insulating layer OIL3. The first upper connection line UCWL may be connected to the connection electrode CM through a contact hole defined in the second organic insulating layer OIL2. The first upper connection line UCWL may be connected to the pixel electrode 511 of the second display element DE2 through a hole defined in the third organic insulating layer OIL3. As illustrated in FIG. 24, the first lower connection line LCWL may be arranged between the inorganic insulating layer IIL and the first organic insulating layer OIL1. The first lower connection line LCWL may be arranged along the inner wall of the groove GV and may be covered by the first organic insulating layer OIL1. The first lower connection line LCWL may be electrically connected to the connection electrode CM through a contact hole defined in the first organic insulating layer OIL1. The first lower connection line LCWL may be connected to the second display element DE2 through the holes defined in the second organic insulating layer OIL2 and the third organic insulating layer OIL3.

The pixel electrode 511 of the first auxiliary display element DE41 may be connected to the connection electrode CM through the second connection line TWL. One end of the second connection line TWL may be connected to the first auxiliary pixel circuit PC41, and the other end thereof may be connected to the pixel electrode 511 of the first auxiliary display element DE41. The second connection line TWL may be a second upper connection line UTWL or a second lower connection line LTWL. As illustrated in FIG. 25, the second upper connection line UTWL may be arranged between the second organic insulating layer OIL2 and the third organic insulating layer OIL3. The second upper connection line UTWL may be electrically connected to the connection electrode CM through a contact hole defined in the second organic insulating layer OIL2. The second upper connection line UTWL may be connected to the pixel electrode 511 of the first auxiliary display element DE41 through a hole defined in the third organic insulating layer OIL3. As illustrated in FIG. 26, the second lower connection line LTWL may be arranged between the inorganic insulating layer IIL and the first organic insulating layer OIL1. The second lower connection line LTWL may be connected to the connection electrode CM through a contact hole defined in the first organic insulating layer OIL1. The second lower connection line LTWL may be connected to the first auxiliary display element DE41 through the holes defined in the second organic insulating layer OIL2 and the third organic insulating layer OIL3.

The first connection line CWL and the second connection line TWL may be an opaque conductive line or a transparent conductive line. The opaque conductive line may include a metal such as molybdenum (Mo), aluminum (Al), copper (Cu), or titanium (Ti) and may include a single layer or multiple layers. The transparent conductive line may include a TCO. In an embodiment, for example, the transparent conductive line may include a conductive oxide such as ITO, IZO, zinc oxide (ZnO), indium oxide ($In_2O_3$), IGO, or AZO. The first connection line CWL and the second connection line TWL may be formed through the same process as a conductive line arranged in the first display area DA1 or may be formed through separate processes. The first connection line CWL and the second connection line TWL may be simultaneously formed through the same process or may be formed through separate processes.

A pixel definition layer 119 may be disposed on the organic insulating layer OIL. An emission layer 513 may be arranged in each pixel to correspond to an opening of the pixel definition layer 119. A first common layer (not illustrated) and/or a second common layer (not illustrated) may be respectively disposed under and over the emission layer 513. An opposite electrode 515 may be disposed over the emission layer 513.

In embodiments of the invention, as described above, the display apparatus may be foldable twice by including two folding areas; however, this is merely an example, and in alternative embodiments, the display apparatus may include one or more folding areas and the entire display apparatus may correspond to the folding area in the case of a display apparatus that is rolled like a scroll.

In embodiments of the invention, as described above, the pixels of the first display area DA1, the second display area DA2, and the third display area DA3 are arranged in a PenTile™ structure. However, the embodiments are not limited thereto. In an alternative embodiment, for example, the pixels of the first display area DA1, the second display area DA2, and the third display area DA3 may be arranged in various pixel arrangement structures such as a stripe structure and a delta structure. Also, the pixel arrangement structures of at least one of the first display area DA1, the second display area DA2, and the third display area DA3 may be different from each other.

According to an embodiment, a high-resolution display apparatus that is flexible and robust against an external impact may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:

a display panel in which a folding area and a non-folding area are defined; and a support layer disposed on the display panel, wherein the support layer includes a first area corresponding to the folding area of the display panel and a second area corresponding to the non-folding area of the display panel, wherein the first area of the support layer comprises a plurality of slits, the folding area of the display panel comprises a slit corresponding area corresponding to a slit of the support layer and a rib corresponding area corresponding to a rib of the support layer, and the display panel comprises:

a substrate including a first surface facing the support layer and a second surface opposite the first surface in a thickness direction thereof;

a first display element disposed in the rib corresponding area over the second surface of the substrate;

a first pixel circuit disposed in the rib corresponding area over the second surface of the substrate and connected to the first display element;

a second display element disposed in the slit corresponding area over the second surface of the substrate; and a second pixel circuit disposed in the rib corresponding area over the second surface of the substrate and connected to the second display element, wherein all pixel circuits of the display panel in the folding area are disposed not to overlap the plurality of slits of the first area of the support layer in a direction perpendicular to the second surface of the substrate of the display panel in a cross-sectional view.

2. The display apparatus of claim 1, wherein the slit of the support layer has a length in a first direction parallel to a folding axis of the folding area.

3. The display apparatus of claim 2, wherein the rib corresponding area of the display panel has a size corresponding to a width of the rib of the support layer in a second direction perpendicular to the first direction of the support layer.

4. The display apparatus of claim 1, wherein the display panel further comprises a first connection line which connects the second display element and the second pixel circuit to each other.

5. The display apparatus of claim 4, wherein the first connection line is arranged on a same layer as a source or drain electrode of a thin film transistor included in the second pixel circuit.

6. The display apparatus of claim 4, wherein the first connection line is in a layer between the second display element and a source or drain electrode of a thin film transistor included in the second pixel circuit.

7. The display apparatus of claim 1, wherein the display panel further comprises an inorganic insulating layer in which a groove is defined to surround each of the first pixel circuit and the second pixel circuit.

8. The display apparatus of claim 7, wherein the display panel further comprises an organic insulating layer covering the groove and disposed over the inorganic insulating layer.

9. The display apparatus of claim 8, wherein the inorganic insulating layer comprises a plurality of inorganic insulating patterns surrounded by the groove, and the organic insulating layer is disposed between the inorganic insulating patterns.

10. The display apparatus of claim 1, wherein the display panel further comprises:

a third display element disposed in the non-folding area; and a third pixel circuit disposed in the non-folding area and connected to the third display element.

11. The display apparatus of claim 1, further comprising:

a component disposed under the display panel, wherein a component area overlapping the component in the non-folding area and an intermediate area between the component area and the non-folding area are defined in the display panel.

12. The display apparatus of claim 11, wherein the component includes at least one selected from a camera, an imaging device, a solar cell, a flash, an illuminance sensor, a proximity sensor, an iris sensor, and a sound receiver.

13. The display apparatus of claim 11, wherein the display panel further comprises:

a fourth display element disposed in the component area;

a fourth pixel circuit disposed in the intermediate area and connected to the fourth display element;

a fifth display element disposed in the intermediate area; and a fifth pixel circuit disposed in the intermediate area and connected to the fifth display element.

14. The display apparatus of claim 13, wherein the component area comprises a transmission area surrounding the fourth display element.

15. The display apparatus of claim 13, wherein the display panel further comprises: a first connection line which connects the second display element and the second pixel circuit to each other; and a second connection line which connects the fourth display element and the fourth pixel circuit to each other.

16. The display apparatus of claim 15, wherein the second connection line is disposed in a same layer as the first connection line and includes a same material as the first connection line.

17. An electronic apparatus comprising the display apparatus of claim 1.

18. A display apparatus comprising:

a display panel in which a folding area and a non-folding area are defined; and a support layer disposed on the display panel and including a first area corresponding to the folding area of the display panel and a second area corresponding to the non-folding area of the display panel, wherein the first area of the support layer comprises a plurality of slits, the folding area of the display panel comprises a slit corresponding area corresponding to a slit of the support layer and a rib corresponding area corresponding to a rib of the support layer, and the display panel comprises:

a substrate including a first surface facing the support layer and a second surface opposite the first surface in a thickness direction thereof;

a first display element disposed in the slit corresponding area over the second surface of the substrate;

a first pixel circuit disposed in the rib corresponding area over the second surface of the substrate and connected to the first display element;

an inorganic insulating layer in which a groove is defined to surround the first pixel circuit; and an organic insulating layer covering the groove and disposed over the inorganic insulating layer, wherein all pixel circuits of the display panel in the folding area are disposed not to overlap the plurality of slits of the first area of the support layer in a direction perpendicular to the second surface of the substrate of the display panel in a cross-sectional view.

19. The display apparatus of claim 18, wherein the display panel further comprises a first connection line which connects the first display element and the first pixel circuit to each other, and the first connection line is disposed in a same layer as a source or drain electrode of a thin film transistor included in the first pixel circuit.

20. The display apparatus of claim 18, wherein the display panel further comprises a first connection line which connects the first display element and the first pixel circuit to each other, and the first connection line is disposed in a layer between the first display element and a source or drain electrode of a thin film transistor included in the first pixel circuit.

21. The display apparatus of claim 18, further comprising:

a component disposed under the display panel, wherein a component area overlapping the component in the non-folding area and an intermediate area between the component area and the non-folding area are defined in the display panel, and the display panel further comprises:

a second display element disposed in the component area; and a second pixel circuit disposed in the intermediate area and connected to the second display element.

22. The display apparatus of claim 21, wherein the display panel further comprises:

a first connection line which connects the first display element and the first pixel circuit to each other; and a second connection line which connects the second display element and the second pixel circuit to each other, and the second connection line is disposed in a same layer as the first connection line and includes a same material as the first connection line.

* * * * *